(12) United States Patent
Hashi et al.

(10) Patent No.: US 10,727,851 B2
(45) Date of Patent: Jul. 28, 2020

(54) ATOMIC OSCILLATOR

(71) Applicant: Seiko Epson Corporation, Tokyo (JP)

(72) Inventors: Yukihiro Hashi, Shiojiri (JP); Koji Chindo, Chino (JP); Yasunori Onishi, Shiojiri (JP); Shunsuke Watanabe, Matsumoto (JP); Katsuhiko Maki, Chino (JP); Mutsuhiko Ota, Matsumoto (JP); Noriaki Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/189,204

(22) Filed: Nov. 13, 2018

(65) Prior Publication Data

US 2019/0149160 A1   May 16, 2019

(30) Foreign Application Priority Data

Nov. 14, 2017   (JP) .................................. 2017-219400
Nov. 14, 2017   (JP) .................................. 2017-219402

(51) Int. Cl.
| | | |
|---|---|---|
| *H01S 1/06* | (2006.01) | |
| *H03B 17/00* | (2006.01) | |
| *H03L 7/26* | (2006.01) | |
| *G04F 5/14* | (2006.01) | |
| *H03L 1/04* | (2006.01) | |

(52) U.S. Cl.
CPC ................ *H03L 7/26* (2013.01); *G04F 5/145* (2013.01); *H03L 1/04* (2013.01); *H03B 17/00* (2013.01)

(58) Field of Classification Search
CPC .. H03L 7/26; H03L 1/04; G04F 5/145; H03B 17/00
USPC ...................................................... 331/3, 94.1
See application file for complete search history.

(56) References Cited

U.S. PATENT DOCUMENTS

| | | | |
|---|---|---|---|
| 9,356,426 B2 * | 5/2016 | Chindo | .................. H01S 5/0687 |
| 2009/0066430 A1 * | 3/2009 | Braun | ....................... G04F 5/14 |
| | | | 331/94.1 |
| 2013/0300510 A1 | 11/2013 | Tamura et al. | |

(Continued)

FOREIGN PATENT DOCUMENTS

| | | |
|---|---|---|
| JP | 2013-236268 A | 11/2013 |
| JP | 2015-002447 A | 1/2015 |

(Continued)

*Primary Examiner* — Richard Tan
(74) *Attorney, Agent, or Firm* — Harness, Dickey & Pierce, P.L.C.

(57) ABSTRACT

An atomic oscillator includes a light source unit including a light source and a first temperature control device controlling the light source to have a first temperature, an atom cell unit including an atom cell accommodating an alkali metal atom and that light emitted from the light source enters and a second temperature control device controlling the atom cell to have a second temperature different from the first temperature, and a container accommodating the light source unit and the atom cell unit and has a first surface and a second surface different from the first surface. The light source unit is mounted to the first surface, and an air gap is present between the light source unit and the second surface. The atom cell unit is mounted to the second surface, and an air gap is present between the atom cell unit and the first surface.

17 Claims, 17 Drawing Sheets

(56) References Cited

U.S. PATENT DOCUMENTS

| | | | |
|---|---|---|---|
| 2015/0102863 A1* | 4/2015 | Hashi | H03L 7/26 331/94.1 |
| 2015/0171325 A1 | 6/2015 | Tanaka et al. | |
| 2015/0180490 A1 | 6/2015 | Chindo | |
| 2017/0099060 A1 | 4/2017 | Chindo | |

FOREIGN PATENT DOCUMENTS

| JP | 2015-118962 A | 6/2015 |
|---|---|---|
| JP | 2015-122597 A | 7/2015 |
| JP | 2017-059865 A | 3/2017 |
| JP | 2017-073623 A | 4/2017 |
| JP | 2017-112515 A | 6/2017 |

\* cited by examiner

ATOMIC OSCILLATOR

CROSS-REFERENCE TO RELATED APPLICATIONS

This application claims priority to Japanese Patent Application No. 2017-219400, filed Nov. 14, 2017, and Japanese Patent Application No. 2017-219402, filed Nov. 14, 2017, the entirety of which are hereby incorporated by reference.

BACKGROUND

1. Technical Field

The present invention relates to an atomic oscillator and a frequency signal generation system.

2. Related Art

As an oscillator having high-precision oscillation characteristics for a long term, there is a known atomic oscillator that oscillates based on energy transition in an alkali metal atom, such as rubidium and cesium.

For example, JP-A-2017-59865 describes an atomic oscillator provided with a gas cell unit including a gas cell in which an alkali metal atom is sealed and a light outputting section including a light source that emits excitation light to the gas cell. The gas cell unit and the light outputting section are disposed via a substrate at the bottom of an outer shell shield made, for example, of permalloy.

For example, JP-A-2015-118962 describes an atomic oscillator provided with a substrate, a gas cell section including a gas cell in which a metal atom is sealed, a light source section including a light source that emits light containing a resonance light pair that resonates with the metal atom, and a support member having one surface connected to the gas cell section and the light source section and the other surface connected to the substrate. JP-A-2015-118962 describes that the support member may be disposed in the form of a cantilever on the substrate.

In general, in an atomic oscillator, it is necessary to control a light source and an atom cell to have different temperatures. In the atomic oscillator described in JP-A-2017-59865, however, the bottom of the outer shell shield could allow the heat of a temperature device that controls the temperature of the light source to be transferred to the atom cell and the heat of a temperature device that controls the temperature of the atom cell to be transferred to the light source. The temperatures of the light source and the atom cell are therefore unstable in some cases and therefore the frequency stability could deteriorate.

As for the atomic oscillator described in JP-A-2015-118962, in a case where force externally acts on the atomic oscillator when it is, for example, carried, the support member bends and the positional relationship between the light source and the gas cell therefore deteriorates in some cases.

SUMMARY

An advantage of some aspects of the invention is to provide an atomic oscillator capable of suppressing unstable temperatures of a light source and an atom cell. Another advantage of some aspects of the invention is to provide a frequency signal generation system capable of suppressing unstable temperatures of a light source and an atom cell. Still another advantage of some aspects of the invention is to provide an atomic oscillator capable of suppressing deformation of a support member. Still another advantage of some aspects of the invention is to provide a frequency signal generation system capable of suppressing deformation of a support member.

The invention can be implemented as the following aspects or application examples.

An atomic oscillator according to an application example of the invention includes a light source unit including a light source and a first temperature control device that controls the light source to have a first temperature, an atom cell unit including an atom cell that accommodates an alkali metal atom and receiving light emitted from the light source, and a second temperature control device that controls the atom cell to have a second temperature different from the first temperature, and a container that accommodates the light source unit and the atom cell unit and has a first surface and a second surface different from the first surface. The light source unit is mounted to the first surface, and an air gap is present between the light source unit and the second surface. The atom cell unit is mounted to the second surface, and an air gap is present between the atom cell unit and the first surface.

In the atomic oscillator according to the application example, the light source unit is mounted to the first surface with an air gap present between the light source unit and the second surface, and the atom cell unit is mounted to the second surface with an air gap present between the atom cell unit and the first surface. Therefore, in the atomic oscillator according to the application example, transfer of the heat of the light source unit (heat of first temperature control device) to the atom cell and transfer of the heat of the atom cell unit (heat of second temperature control device) to the light source via the container can be suppressed as compared with a case where the light source unit and the atom cell unit are mounted to the same surface of the container. Therefore, in the atomic oscillator according to the application example, unstableness of the temperatures of the light source and the atom cell can be suppressed.

In the atomic oscillator according to the application example, the first surface and the second surface may face each other.

In the atomic oscillator according to the application example with this configuration, in which the first surface and the second surface face each other, the heat of the light source unit and the heat of the atom cell unit can be transferred in opposite directions, whereby transfer of the heat of the light source unit to the atom cell and transfer of the heat of the atom cell unit to the light source can be more reliably suppressed.

In the atomic oscillator according to the application example, the container may include a first member that has the first surface and a second member that has the second surface and is a member separate (discrete) from the first member.

In the atomic oscillator according to the application example with this configuration, in which the container includes the first member, which has the first surface, and the second member, which has the second surface, heat is unlikely to transfer between the first surface and the second surface. Therefore, in the atomic oscillator according to the application example, transfer of the heat of the light source unit to the atom cell and transfer of the heat of the atom cell unit to the light source can be more reliably suppressed.

In the atomic oscillator according to the application example, the container may include a third member located between the first member and the second member and having thermal conductivity lower than thermal conductivity of the first member and thermal conductivity of the second member.

In the atomic oscillator according to the application example with this configuration, in which the container includes the third member located between the first member and the second member and having thermal conductivity lower than the thermal conductivity of each of the first and second members, heat is unlikely to transfer between the first member and the second member. Therefore, in the atomic oscillator according to the application example, transfer of the heat of the light source unit to the atom cell and transfer of the heat of the atom cell unit to the light source can be more reliably suppressed.

The atomic oscillator according to the application example may further include a substrate on which the light source unit and the atom cell unit are disposed, and thermal resistance along a path between the light source unit and the atom cell unit via the substrate may be higher than thermal resistance between the light source unit and the first surface and thermal resistance between the atom cell unit and the second surface.

In the atomic oscillator according to the application example with this configuration, in which the thermal resistance along the path between the light source unit and the atom cell unit via the substrate is higher than the thermal resistance between the light source unit and the first surface and the thermal resistance between the atom cell unit and the second surface, transfer of the heat of the light source unit to the atom cell and transfer of the heat of the atom cell unit to the light source via the substrate can be suppressed.

In the atomic oscillator according to the application example, the substrate may be disposed on the first surface, and a heat transfer member may be disposed between the substrate and the first surface.

In the atomic oscillator according to the application example with this configuration, since a heat transfer member is disposed between the substrate and the first surface, heat is allowed to readily transfer between the substrate and the container having the first surface.

In the atomic oscillator according to the application example, the atom cell unit may include an atom cell container that accommodates the atom cell, and a thermally insulating member may be disposed between the atom cell container and the substrate.

In the atomic oscillator according to the application example with this configuration, in which a thermally insulating member is disposed between the atom cell container and the substrate, heat is unlikely to transfer between the atom cell container and the support member. Therefore, in the atomic oscillator according to the application example, transfer of the heat of the light source unit to the atom cell and transfer of the heat of the atom cell unit to the light source can be more reliably suppressed.

In the atomic oscillator according to the application example, the light source unit and the container may be mounted to each other only via the first surface, and the atom cell unit and the container may be mounted to each other only via the second surface.

In the atomic oscillator according to the application example with this configuration, in which the light source unit is mounted to the container only via the first surface, and the atom cell unit is mounted to the container only via the second surface, transfer of the heat of the light source unit to the atom cell and transfer of the heat of the atom cell unit to the light source via the container can be more reliably suppressed, as compared with a case where the light source unit or the atom cell unit is mounted to the container also via another surface.

A frequency signal generation system according to an application example of the invention is a frequency signal generation system including an atomic oscillator, the atomic oscillator including a light source unit including a light source and a first temperature control device that controls the light source to have a first temperature, an atom cell unit including an atom cell that accommodates an alkali metal atom and receiving light emitted from the light source, and a second temperature control device that controls the atom cell to have a second temperature different from the first temperature, and a container that accommodates the light source unit and the atom cell unit and has a first surface and a second surface different from the first surface. The light source unit is mounted to the first surface, and an air gap is present between the light source unit and the second surface. The atom cell unit is mounted to the second surface, and an air gap is present between the atom cell unit and the first surface.

In the frequency signal generation system according to the application example, the light source unit is mounted to the first surface with an air gap present between the light source unit and the second surface, and the atom cell unit is mounted to the second surface with an air gap present between the atom cell unit and the first surface. Therefore, in the frequency signal generation system according to the application example, unstableness of the temperatures of the light source and the atom cell can be suppressed.

An atomic oscillator according to an application example of the invention includes a substrate, a light source, an atom cell that accommodates an alkali metal atom and receiving light emitted from the light source, a support member on which the light source and the atom cell are disposed and which includes a portion fixed to the substrate and an end portion separate from the substrate via an air gap, and a protrusion that is disposed in a position closer to the end portion than to the fixed portion of the support member and protrudes toward the substrate.

The atomic oscillator according to the application example includes the protrusion, which is disposed in a position closer to the end portion than to the fixed portion of the support member and protrudes toward the substrate. Therefore, when force externally acts on the atomic oscillator and the support member therefore bends, the protrusion comes into contact with the substrate. Therefore, in the atomic oscillator according to the application example, deformation of the support member can be suppressed as compared with a case where no protrusion is disposed.

In the atomic oscillator according to the application example, when the support member bends so that the end portion approaches the substrate, the protrusion may come into contact with the substrate before the support member does.

In the atomic oscillator according to the application example with this configuration, in which the protrusion comes into contact with the substrate before the support member does when the support member bends so that the end portion approaches the substrate, deformation of the support member can be suppressed as compared with the case where no protrusion is disposed.

In the atomic oscillator according to the application example, an air gap may be present between the protrusion and the substrate.

In the atomic oscillator according to the application example with this configuration, in which an air gap is present between the protrusion and the substrate, heat transfer, for example, from the support member and the protrusion to the substrate can be suppressed. The temperature of the atom cell or the light source is therefore likely to be stable as compared with a case where no air gap is present between the protrusion and the substrate.

In the atomic oscillator according to the application example, at least a portion that is part of the protrusion and faces the substrate may be made of a thermally insulating material.

In the atomic oscillator according to the application example with this configuration, in which at least the portion that is part of the protrusion and faces the substrate is made of a thermally insulating material, even when the protrusion comes into contact with the substrate, heat transfer, for example, between the protrusion and the substrate can be suppressed.

In the atomic oscillator according to the application example, at least a portion that is part of the substrate and faces the protrusion may be made of a thermally insulating material.

In the atomic oscillator according to the application example with this configuration, in which at least the portion that is part of the substrate and faces the protrusion is made of a thermally insulating material, even when the protrusion comes into contact with the substrate, heat transfer, for example, between the protrusion and the substrate can be suppressed.

In the atomic oscillator according to the application example, out of the fixed portion and the end portion of the support member, the light source may be disposed at the fixed portion, and out of the fixed portion and the end portion of the support member, the atom cell may be disposed at the end portion.

In the atomic oscillator according to the application example with this configuration, even when the support member bends, the protrusion can suppress shift of the atom cell with respect to the light source.

The atomic oscillator according to the application example may further include a container that accommodates the light source, the atom cell, and the support member and has the substrate and a lid, and the atom cell may be mounted to the lid.

In the atomic oscillator according to the application example with this configuration, in which the atom cell is mounted to the lid, for example, even when force acts on the lid, and the support member, on which the atom cell is disposed, therefore bends, the protrusion can suppress deformation of the support member.

In the atomic oscillator according to the application example, out of the fixed portion and the end portion of the support member, the atom cell may be disposed at the fixed portion, and out of the fixed portion and the end portion of the support member, the light source may be disposed at the end portion.

In the atomic oscillator according to the application example with this configuration, even when the support member bends, the protrusion can suppress shift of the light source with respect to the atom cell.

A frequency signal generation system according to an application example of the invention is a frequency signal generation system including an atomic oscillator, the atomic oscillator including a substrate, a light source, an atom cell that accommodates an alkali metal atom and receiving light emitted from the light source, a support member on which the light source and the atom cell are disposed and which includes a portion fixed to the substrate and an end portion separate from the substrate via an air gap, and a protrusion that is disposed in a position closer to the end portion than to the fixed portion of the support member and protrudes toward the substrate.

Since the frequency signal generation system according to the application example includes the protrusion, which is disposed at the free end of the support member and protrudes toward the substrate, deformation of the support member can be suppressed as compared with a case where no protrusion is disposed.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

A preferable embodiment of the invention will be described below in detail with reference to the drawings. It is not intended that the embodiment described below limits the scope of the invention set forth in the appended claims.

Further, all configurations described below are not necessarily essential requirements of the invention.

1. Atomic Oscillator
1.1. Overview

Figure 1:
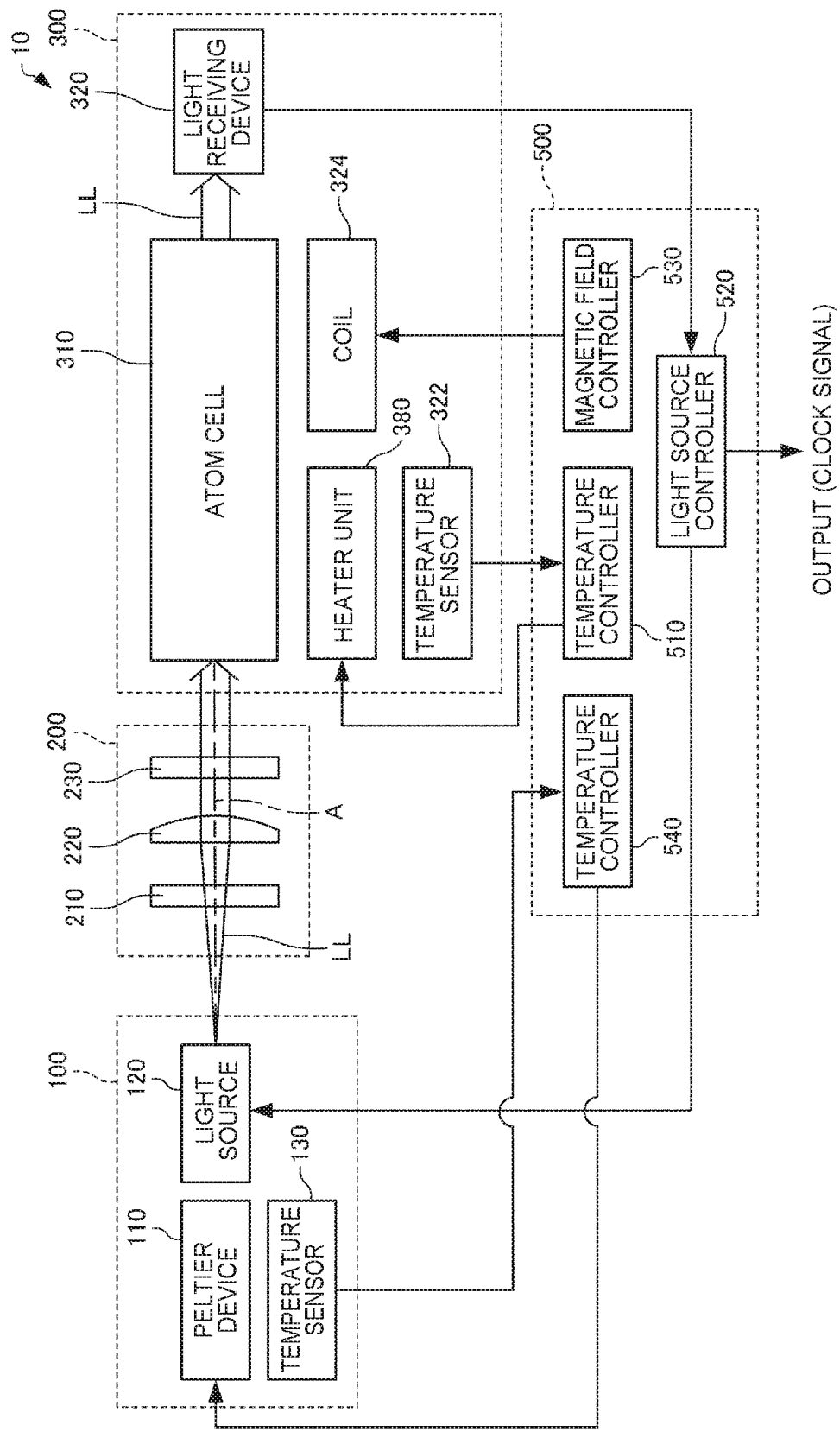
FIG. 1 is a schematic view showing an atomic oscillator according to an embodiment.

An atomic oscillator according the present embodiment will first be described with reference to the drawings. FIG. 1 is a schematic view showing an atomic oscillator 10 according to the present embodiment.

The atomic oscillator 10 is an atomic oscillator using coherent population trapping (CPT) that produces a phenomenon in which when an alkali metal atom is irradiated with two resonance light fluxes having specific different wavelengths at the same time, the two resonance light fluxes are not absorbed by the alkali metal atom but pass therethrough. The phenomenon based on the coherent population trapping is also called an electromagnetically induced transparency (EIT) phenomenon. The atomic oscillator according to the embodiment of the invention may instead be an atomic oscillator using a double resonance phenomenon based on light and microwaves.

The atomic oscillator 10 includes a light source unit 100, an optical system unit 200, an atom cell unit 300, and a control unit 500, which controls the light source unit 100 and the atom cell unit 300, as shown in FIG. 1. An overview of the atomic oscillator 10 will first be described below.

The light source unit 100 includes a Peltier device 110, a light source 120, and a temperature sensor 130.

The light source 120 emits linearly polarized light LL containing two types of light having different frequencies. The light source 120 is a light emitting device, such as a vertical cavity surface emitting laser (VCSEL). The temperature sensor 130 detects the temperature of the light source 120. The Peltier device 110 is a first temperature control device that controls the temperature of the light source 120 to be a first temperature. Specifically, the Peltier device 110 heats or cools the light source 120. The first temperature is, for example, higher than or equal to 25° C. but lower than or equal to 35° C.

The optical system unit 200 is disposed between the light source unit 100 and the atom cell unit 300. The optical system unit 200 includes a light attenuation filter 210, a lens 220, and a quarter-wave plate 230.

The light attenuation filter 210 attenuates the intensity of the light LL emitted from the light source 120. The lens 220 adjusts the radiation angle of the light LL. Specifically, the lens 220 parallelizes the light LL. The quarter-wave plate 230 converts the two types of light contained in the light LL and having different frequencies from the linearly polarized light into circular polarized light.

The atom cell unit 300 includes an atom cell 310, a light receiving device 320, a heater unit 380, a temperature sensor 322, and a coil 324.

The atom cell 310 transmits the light LL emitted from the light source 120. The atom cell 310 accommodates an alkali metal atom. The alkali metal atom has three-level-system energy levels formed of two ground levels different from each other and an excitation level. The light LL emitted from the light source 120 enters the atom cell 310 via the light attenuation filter 210, the lens 220, and the quarter-wave plate 230.

The light receiving device 320 receives and detects the light LL having passed through the atom cell 310. The light receiving device 320 is, for example, a photodiode.

The heater unit 380 is a second temperature control device that controls the temperature of the atom cell 310 to be a second temperature different from the first temperature. The heater unit 380 heats the alkali metal atom accommodated in the atom cell 310 to convert the state of at least part of the alkali metal atom into a gaseous alkali metal atom. The second temperature is, for example, higher than or equal to 60° C. but lower than or equal to 70° C.

The temperature sensor 322 detects the temperature of the atom cell 310. The coil 324 applies a magnetic field in a predetermined direction to the alkali metal atom accommodated in the atom cell 310 to cause the energy levels of the alkali metal atom to undergo Zeeman splitting.

In the state in which the alkali metal atom has undergone Zeeman splitting, when the alkali metal atom is irradiated with a circularly polarized resonance light pair, a plurality of levels of the alkali metal atom having undergone Zeeman splitting is configured so that the number of alkali metal atoms having a desired energy level is greater than the number of alkali metal atoms having the other energy levels. Therefore, the number of atoms that express a desired EIT phenomenon increases, and the magnitude of a desired EIT signal increases accordingly. As a result, the oscillation characteristics of the atomic oscillator 10 can be improved.

The control unit 500 includes a temperature controller 510, a light source controller 520, a magnetic field controller 530, and a temperature controller 540.

The temperature controller 510 controls energization of the heater unit 380 based on the result of the detection performed by the temperature sensor 322 in such a way that a desired temperature is achieved in the atom cell 310. The magnetic field controller 530 controls energization of the coil 324 in such a way that the coil 324 produces a constant magnetic field. The temperature controller 540 controls energization of the Peltier device 110 based on the result of the detection performed by the temperature sensor 130 in such a way that the light source 120 has a desired temperature.

The light source controller 520 controls the frequencies of the two types of light contained in the light LL emitted from the light source 120 based on the result of the detection performed by the light receiving device 320 in such a way that the EIT phenomenon occurs. It is noted that the EIT phenomenon occurs when the two types of light form a resonance light pair having a frequency difference corresponding to the difference in energy between the two ground levels of the alkali metal atom accommodated in the atom cell 310. The light source controller 520 includes a voltage-controlled oscillator (not shown) having an oscillation frequency controlled so as to be stabilized in synchronization with the control of the frequencies of the two types of light, and the light source controller 520 outputs an output signal from the voltage-controlled oscillator (VCO) as an output signal (clock signal) from the atomic oscillator 10.

1.2. Specific Configuration

Figure 2:
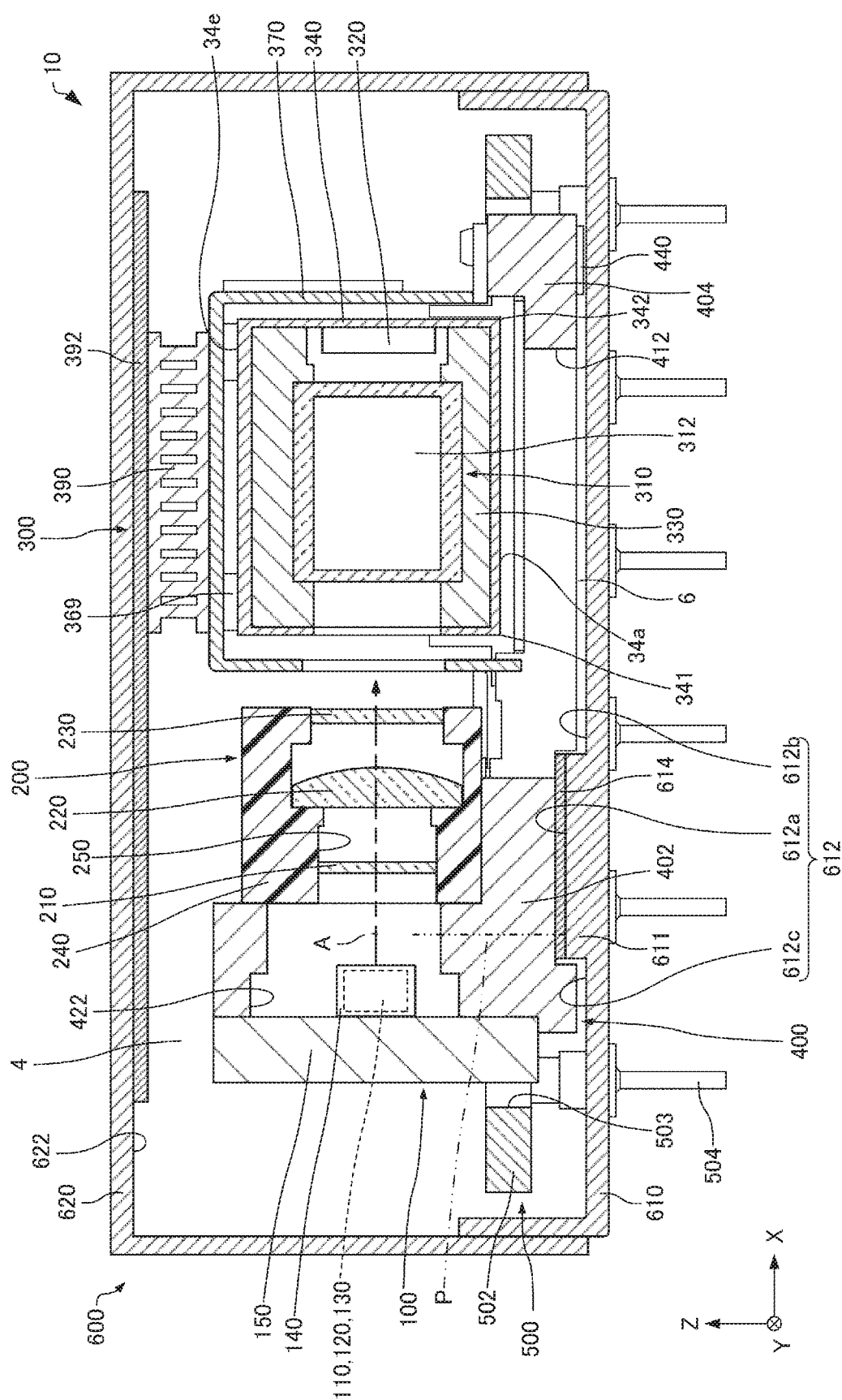
FIG. 2 is a cross-sectional view diagrammatically showing the atomic oscillator according to the embodiment.
Figure 3:
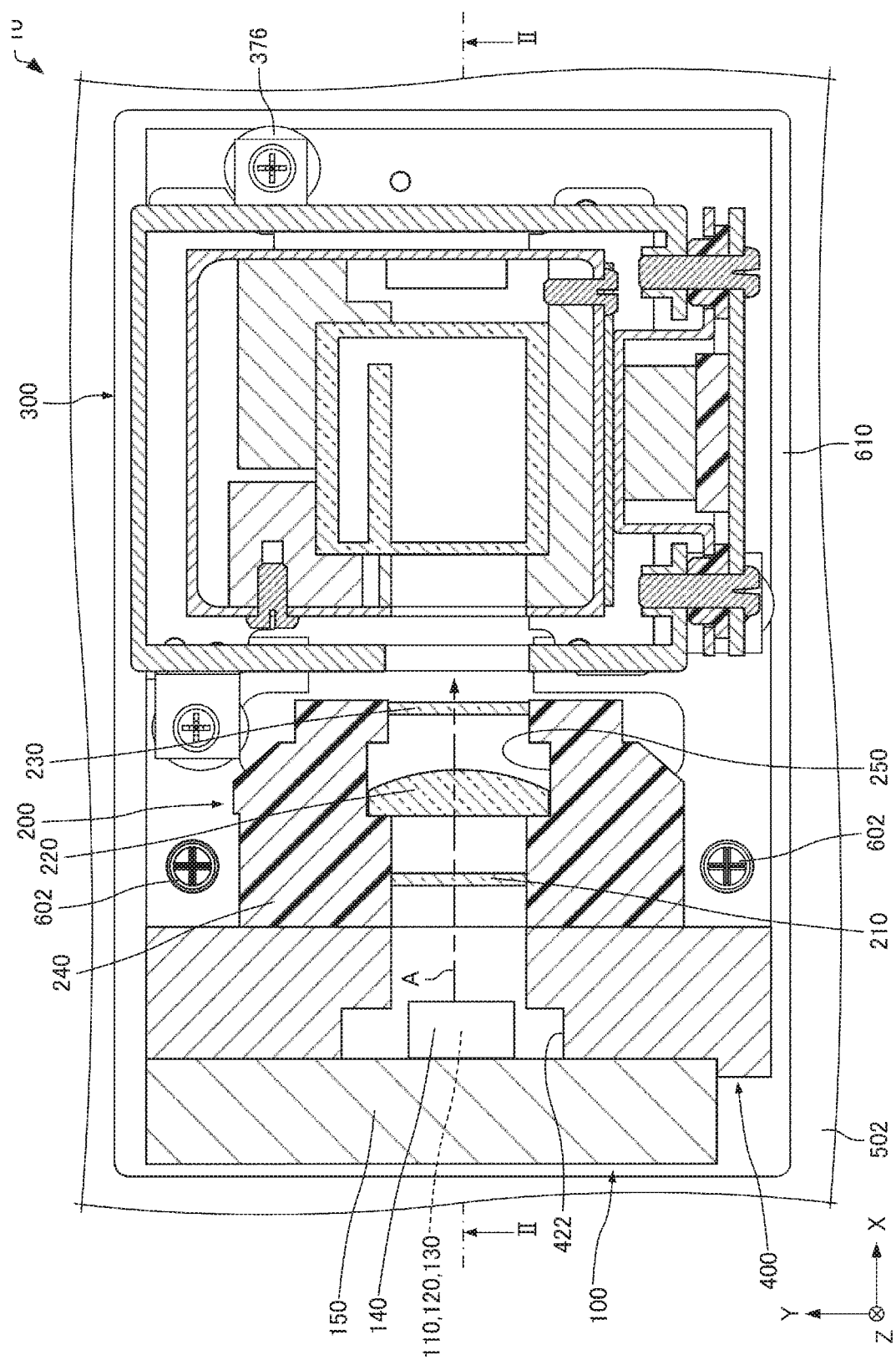
FIG. 3 is a cross-sectional view diagrammatically showing the atomic oscillator according to the embodiment.

A specific configuration of the atomic oscillator 10 will be described next. FIGS. 2 and 3 are cross-sectional views diagrammatically showing the atomic oscillator 10. FIG. 2 is a cross-sectional view taken along the line II-II in FIG. 3. In FIGS. 2 and 3, FIGS. 4 to 13, which will be described later, and FIGS. 19 and 20, which will be described later, an axis X, an axis Y, and an axis Z are drawn as three axes perpendicular to one another.

The atomic oscillator 10 includes the light source unit 100 (light source assembly 100), the optical system unit 200 (optical system assembly 200), the atom cell unit 300 (atom cell assembly 300), a support member (substrate) 400, the control unit 500 (controller 500), and an outer container 600 (housing), as shown in FIGS. 2 and 3.

The axis Z is an axis along a perpendicular P to a first outer container surface 612 of an outer base 610, and a +Z-axis direction is the direction from the first outer container surface 612 of the outer base 610 toward parts disposed on the first outer container surface 612. The axis X is an axis along the light LL outputted from the light source unit 100, and a +X-axis direction is the direction in which the light LL travels. The axis Y is the axis perpendicular to the axes X and Z, and a +Y-axis direction is the direction from the near side toward the far side in a case where the +Z-axis direction is oriented upward and the +X-axis direction is oriented rightward.

The light source unit 100 is disposed on the support member 400. The light source unit 100 includes the Peltier device 110, the light source 120, the temperature sensor 130, a light source container 140, which accommodates the Peltier device 110, the light source 120, and the temperature sensor 130, and a light source substrate 150, on which the light source container 140 is disposed. The light source substrate 150 is fixed to the support member 400, for example, with screws (not shown). The Peltier device 110, the light source 120, and the temperature sensor 130 are electrically connected to the control unit 500.

The optical system unit 200 is disposed on the support member 400. The optical system unit 200 includes the light attenuation filter 210, the lens 220, the quarter-wave plate 230, and a holder 240, which holds the light attenuation filter 210, the lens 220, the quarter-wave plate 230. The holder 240 is fixed to the support member 400, for example, with screws (not shown).

The holder 240 is provided with a through hole 250. The through hole 250 is a region through which the light LL passes. In the through hole 250, the light attenuation filter 210, the lens 220, and the quarter-wave plate 230 are disposed in the presented (sequential) order from the side facing the light source unit 100.

Figure 4:
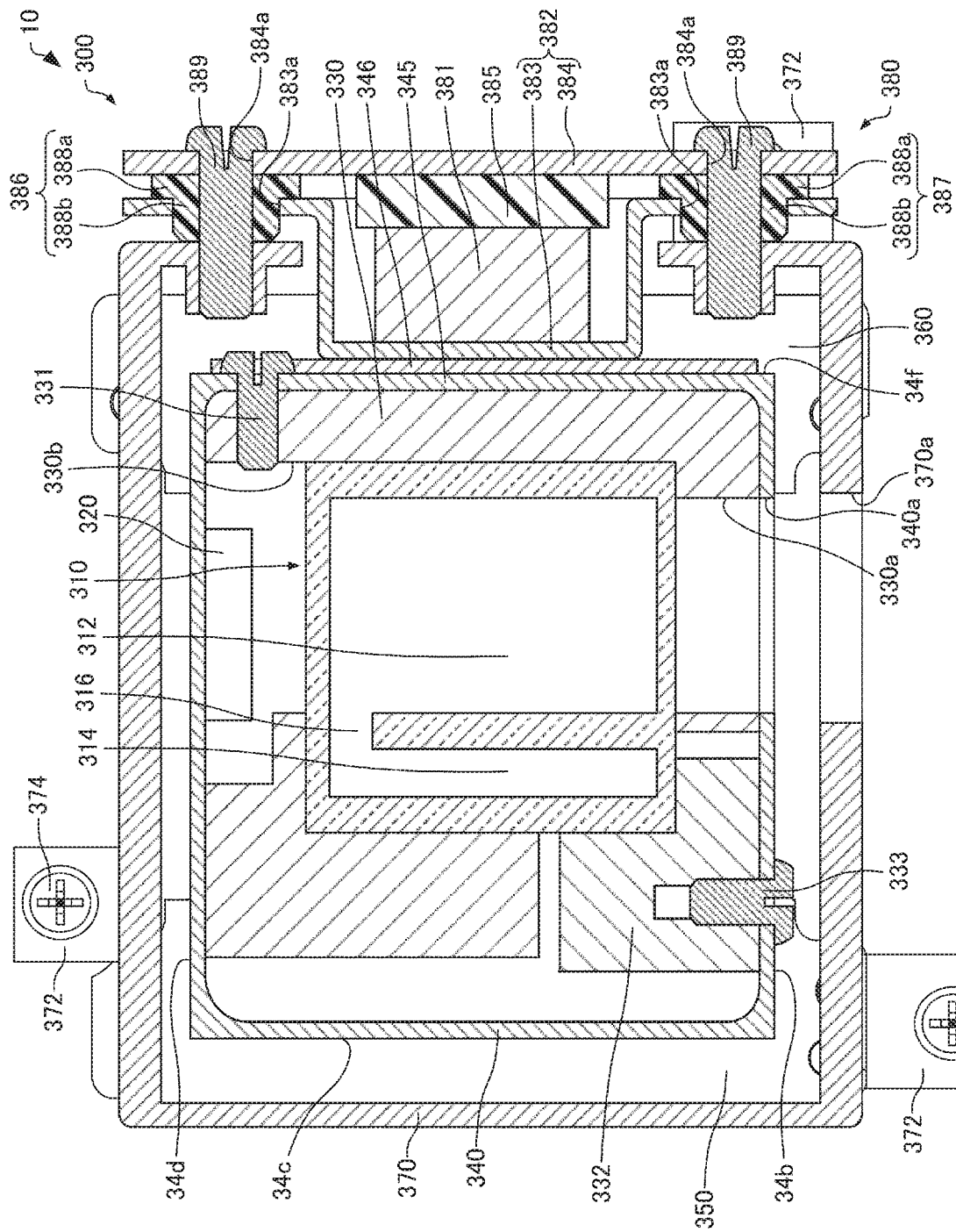
FIG. 4 is a cross-sectional view diagrammatically showing an atom cell unit of the atomic oscillator according to the embodiment.

FIG. 4 is a cross-sectional view diagrammatically showing the atom cell unit 300. The atom cell unit 300 includes the atom cell 310, the light receiving device 320, a first holding member 330, a screw 331, a second holding member 332, a first atom cell container 340, a first positioning member 350, a second positioning member 360, spacers 369, a second atom cell container 370, the heater unit 380, and a Peltier device 390, as shown in FIGS. 2 to 4.

The atom cell 310 accommodates an alkali metal atom, such as gaseous rubidium, cesium, or sodium. The atom cell 310 may accommodate, as required, argon, neon, or any other rare gas or nitrogen or any other inert gas as a buffer gas along with the alkali metal atom.

The light LL emitted from the light source 120 enters the atom cell 310. The wall of the atom cell 310 is made, for example, of glass. The wall of the atom cell 310 defines an internal space in the atom cell 310. The internal space in the atom cell 310 includes a first space 312, a second space 314, and a communication hole 316, as shown in FIG. 4.

The pressure in the first space 312 is, for example, the saturation vapor pressure of the alkali metal atom. The light LL emitted from the light source 120 passes through the first space 312. The second space 314 communicates with the first space 312 via the communication hole 316. The volume of the second space 314 is smaller, for example, than the volume of the first space 312. The temperature in the second space 314 is adjusted so as to be lower than the temperature in the first space 312. The alkali metal atom, for example, in a liquid form is therefore present in the second space 314. Therefore, in a case where the gaseous alkali metal atom in the first space 312, for example, reacts with the wall of the atom cell 310 and the amount of alkali metal atom decreases accordingly, the liquid alkali metal atom vaporizes, whereby the concentration of the gaseous alkali metal atom in the first space 312 can be maintained at a fixed value.

The light receiving device 320 is disposed on the side opposite the light source 120 with respect to the atom cell 310. In the example shown in FIGS. 2 to 4, the light receiving device 320 is disposed in the first atom cell container 340. The light receiving device 320 is electrically connected to the control unit 500.

The first holding member 330 holds the atom cell 310 in the first atom cell container 340. The first holding member 330 is in contact, for example, with the wall that forms the atom cell 310 and defines the first space 312. In the example shown in FIGS. 2 to 4, the first holding member 330 is fixed to a wall 345 of the first atom cell container 340 with the screw 331. The wall 345 is a −Y-axis-direction-side wall of the first atom cell container 340. The first holding member 330 transfers the heat of the heater unit 380 to the alkali metal atom in the first space 312. The first holding member 330 is made, for example, of aluminum, titanium, copper, or brass.

The first holding member 330 is provided with through holes 330a and 330b. The light LL emitted from the light source 120 passes through the through hole 330a and enters the atom cell 310. The light LL having passed through the atom cell 310 passes through the through hole 330b and impinges on the light receiving device 320. A member that transmits the light LL may be disposed in each of the through holes 330a and 330b.

The second holding member 332 holds the atom cell 310 in the first atom cell container 340. The second holding member 332 is in contact, for example, with the wall that forms the atom cell 310 and defines the second space 314. In the example shown in FIGS. 2 to 4, the second holding member 332 is fixed to the first atom cell container 340 with a screw 333. The second holding member 332 transfers, for example, heat in the second space 314 to the Peltier device 390. The second holding member 332 is provided so as to be separate from the first holding member 330. The temperature in the second space 314 can therefore be adjusted so as to be lower than the temperature in the first space 312. The second holding member 332 is made of the same material of which the first holding member 330 is made.

The first atom cell container 340 accommodates the atom cell 310, the light receiving device 320, and the holding members 330 and 332. The first atom cell container 340 is disposed on the support member 400 via the positioning members 350 and 360. The first atom cell container 340 has a roughly cubic outer shape. The first atom cell container 340 is made, for example, of iron, ferrosilicon, permalloy, supermalloy, Sendust, or copper. The first atom cell container 340 made of any of the materials described above can shield external magnetism. An effect of external magnetism on the alkali metal atom in the atom cell 310 can therefore be suppressed, whereby stable oscillation characteristics of the atomic oscillator 10 can be achieved. The term "suppress" includes a case where occurrence of a certain event is completely avoided and a case where even when the certain event occurs, the degree of the event is reduced.

The first atom cell container 340 is provided with a through hole 340a. The light LL emitted from the light source 120 passes through the through hole 340a and enters the atom cell 310. A member that transmits the light LL may be provided in the through hole 340a.

A heat transfer member 346 is disposed on an outer surface 34f of the first atom cell container 340. In the example shown in FIGS. 2 to 4, the heat transfer member 346 has a plate shape and is fixed to the wall 345 of the first atom cell container 340 with the screw 331. The heat transfer member 346 is disposed between the first atom cell container 340 and the heater unit 380. The thermal conductivity of the heat transfer member 346 is higher, for example, than the thermal conductivity of the first atom cell container 340 and the thermal conductivity of a heater lid 383 of the heater unit 380. The heat transfer member 346 transfers the heat of the heater unit 380 to the alkali metal atom in the first space 312. The heat transfer member 346 is made, for example, of aluminum or copper.

Figure 5:
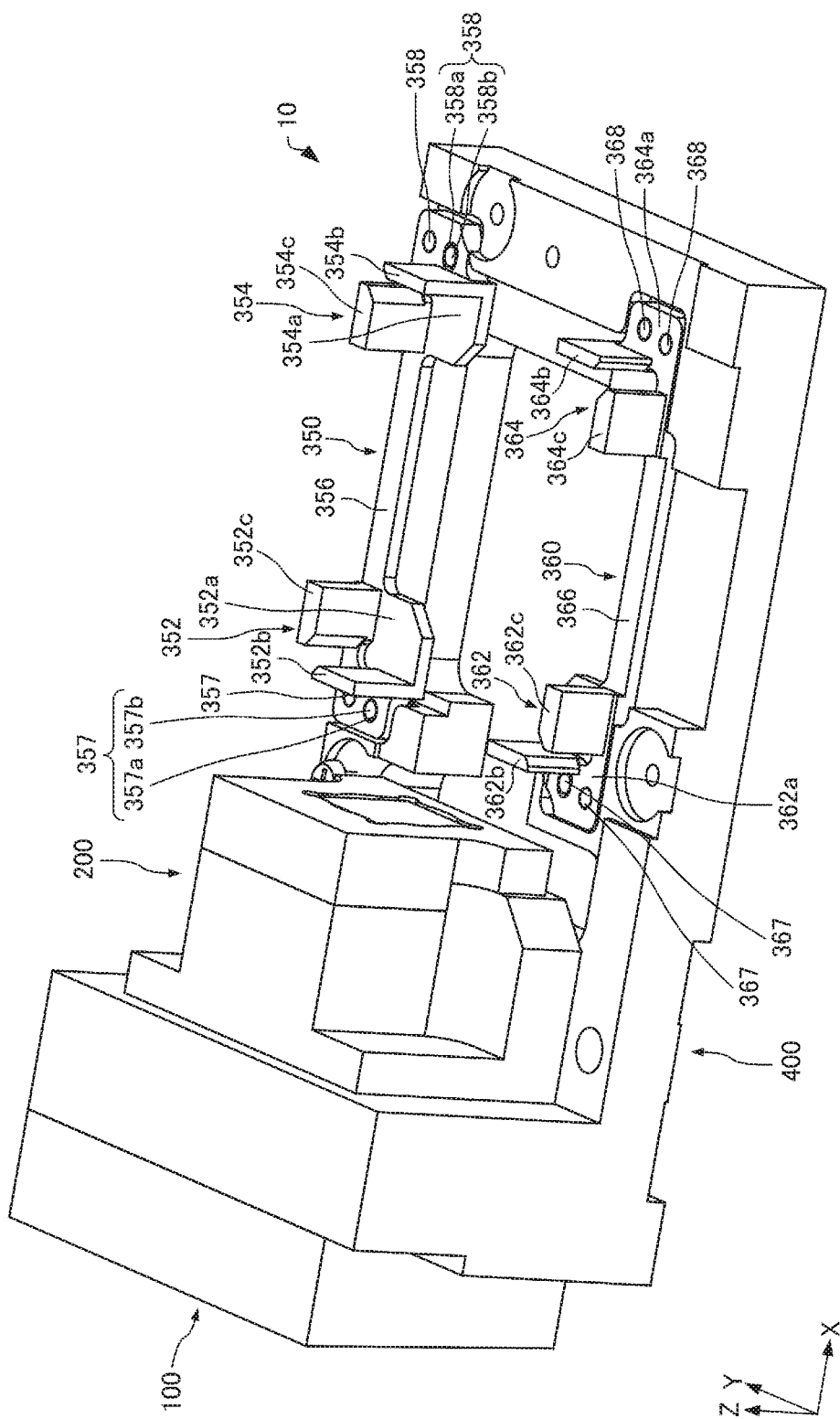
FIG. 5 is a perspective view diagrammatically showing the atomic oscillator according to the embodiment.
Figure 6:
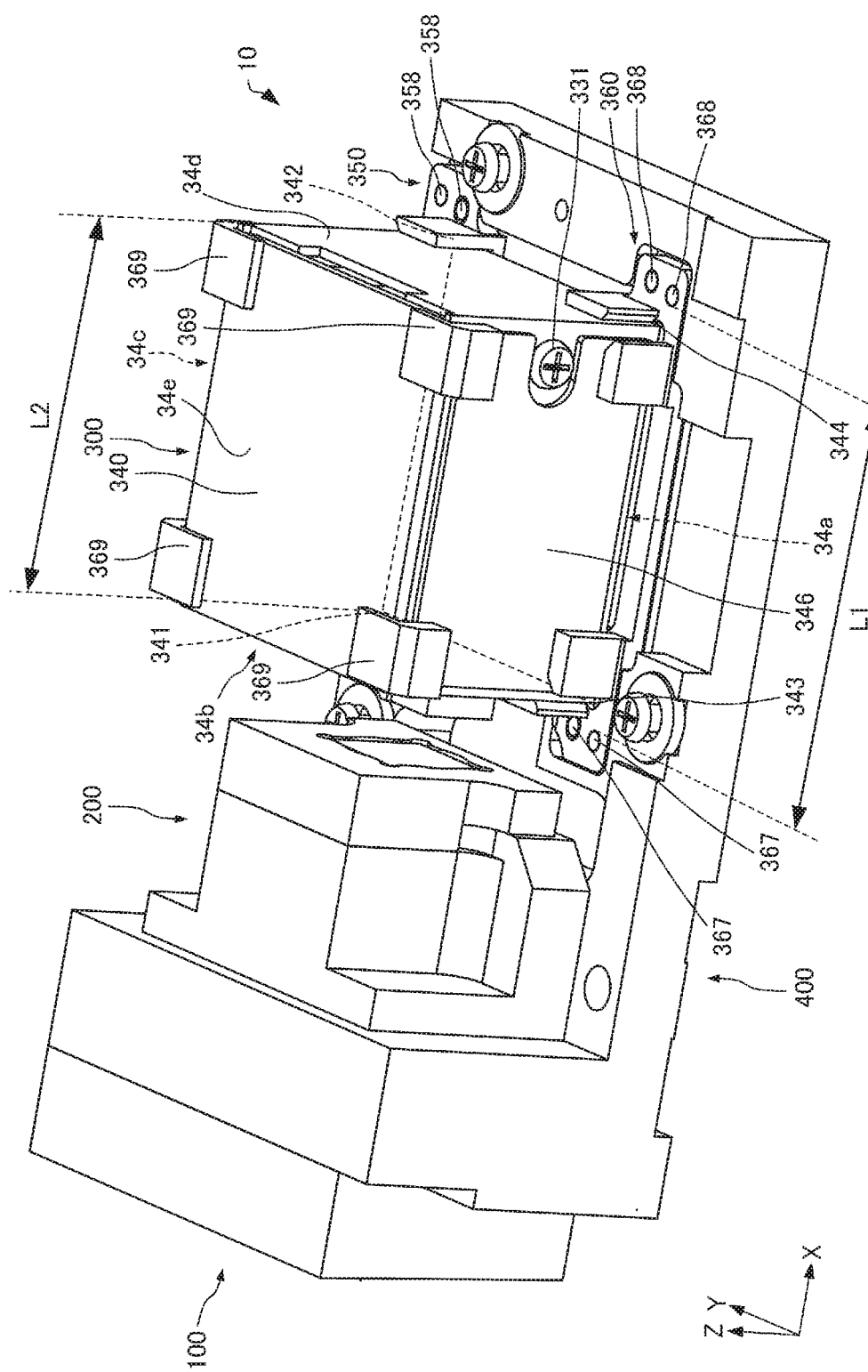
FIG. 6 is a perspective view diagrammatically showing the atomic oscillator according to the embodiment.
Figure 7:
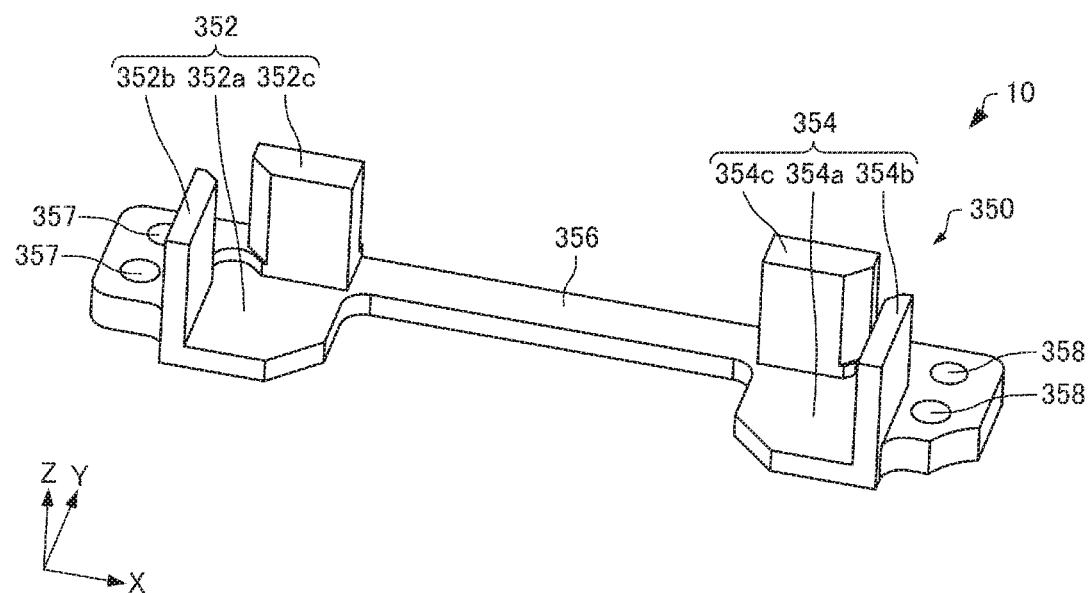
FIG. 7 is a perspective view diagrammatically showing a first positioning member of the atomic oscillator according to the embodiment.
Figure 8:
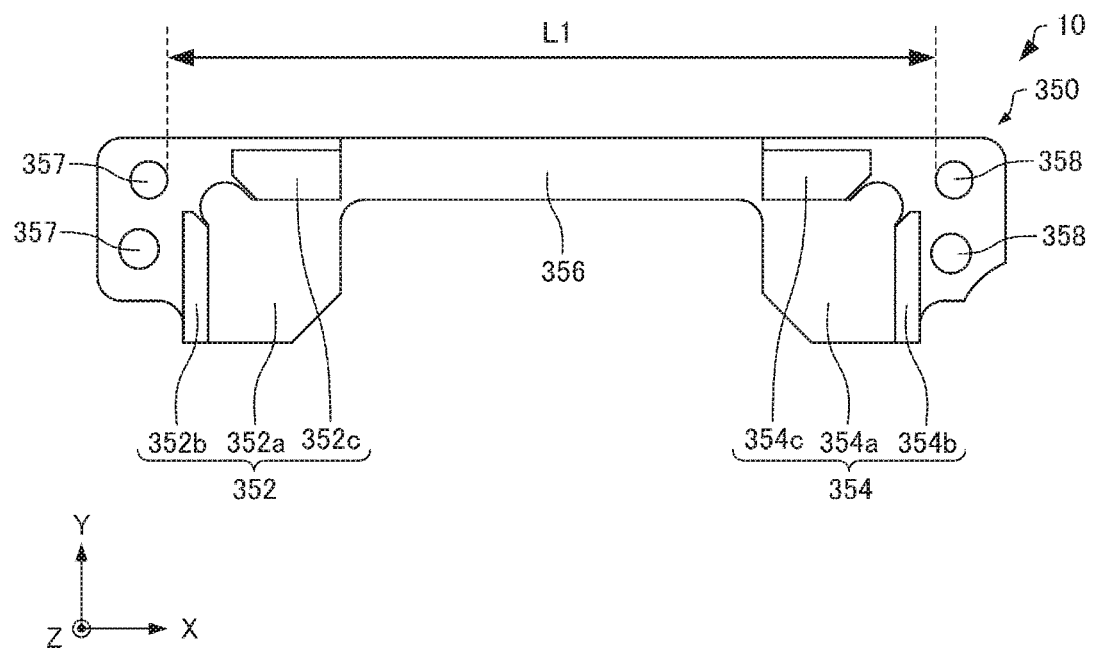
FIG. 8 is a plan view diagrammatically showing the first positioning member of the atomic oscillator according to the embodiment.

FIGS. 5 and 6 are perspective views diagrammatically showing the atomic oscillator 10 according to the present embodiment. FIG. 7 is a perspective view diagrammatically showing the first positioning member 350. FIG. 8 is a plan view diagrammatically showing the first positioning member 350. In FIGS. 5 and 6, part of the members of the atomic oscillator 10 is omitted for convenience.

The first positioning member 350 and the second positioning member 360 are disposed on the support member 400, as shown in FIGS. 5 and 6. The first positioning member 350 and the second positioning member 360 are fixed to the support member 400. The support member 400 and the first positioning member 350 are members independent of each other. That is, the support member 400 and the first positioning member 350 are not integrated with each other and are members separate from each other. Similarly, the support member 400 and the second positioning member 360 are members independent of each other. The material of the support member 400 differs from the material of the positioning members 350 and 360. Although not shown, the support member 400 may be integrated with the first positioning member 350 and the second positioning member 360. That is, a structural element having the same shape of the positioning members 350 and 360 may be formed as part of the support member 400. Providing at least the first positioning member 350 allows the atom cell 310 to be disposed on the support member 400 with high positional precision. That is, the second positioning member 360 may be omitted. In the case where the second positioning member 360 is provided, the two positioning members, the first positioning member 350 and the second positioning member 360, can position the atom cell 310.

The first positioning member 350 is disposed on the +Y-axis-direction side of the first atom cell container 340. The second positioning member 360 is disposed on the −Y-axis-direction side of the first atom cell container 340. The first atom cell container 340, when viewed in the Z-axis direction (direction along perpendicular P), is disposed between the first positioning member 350 and the second positioning member 360.

The first positioning member 350 and the second positioning member 360 are members that position the first atom cell container 340 with respect to the support member 400. To dispose the first atom cell container 340 on the support member 400, the positioning members 350 and 360 are first fixed to the support member 400, as shown in FIG. 5. The positioning members 350 and 360 are then used to dispose the first atom cell container 340 on the support member 400 and to position the first atom cell container 340 with respect to the support member 400, as shown in FIG. 6.

The first atom cell container 340 has a first corner 341 and a second corner 342. The first corner 341 is a −X-axis-direction-side and +Y-axis-direction-side corner of the first atom cell container 340 in the example shown in FIG. 6. Outer surface 34a, 34b, and 34c intersect one another, and the portion where the three surfaces intersect one another is the first corner 341. The second corner 342 is a +X-axis-direction-side and +Y-axis-direction-side corner of the first atom cell container 340. The outer surface 34a, 34c, and 34d intersect one another, and the portion where the three surfaces intersect one another is the second corner 342. The first positioning member 350 includes a first block 352, which is in contact with the first corner 341, a second block 354, which is in contact with the second corner 342, and a connector 356, which connects the first block 352 and the second block 354 to each other.

"A corner of the first atom cell container 340" has a vertex where three outer surfaces of the first atom cell container 340 intersect one another and includes a portion in the vicinity of the vertex. The "portion in the vicinity of the vertex" is, for example, a portion starting from the vertex where the three outer surfaces intersect one another and extending over one fourth the length of each edge of the outer surfaces.

The first block 352 includes a block base 352a and block walls 352b and 352c, which extend from the block base 352a in the +Z-axis direction. The block base 352a is in contact with the −Z-axis-direction-side outer surface 34a of the first atom cell container 340. The block wall 352b is in contact with the −X-axis-direction-side outer surface 34b of the first atom cell container 340. The block wall 352c is in contact with the +Y-axis-direction-side outer surface 34c of the first atom cell container 340. The outer surface 34a, 34b, and 34c intersect one another, and the portion where the three surfaces intersect one another is the first corner 341. As described above, the first block 352 is in contact with the three outer surfaces 34a, 34b, and 34c of the first atom cell container 340. The first positioning member 350 can therefore position the first atom cell container 340 in the X-axis, Y-axis, and Z-axis directions.

The second block 354 includes a block base 354a and block walls 354b and 354c, which extend from the block base 354a in the +Z-axis direction. The block base 354a is in contact with the −Z-axis-direction-side outer surface 34a of the first atom cell container 340. The block wall 354c is in contact with the +Y-axis-direction-side outer surface 34c of the first atom cell container 340. The block wall 354b faces the +X-axis-direction-side outer surface 34d of the first atom cell container 340. The block wall 354b may be in contact with the outer surface 34d or may be separate therefrom.

The first block 352 is fixed to the support member 400 with first fixing structures 357. The first fixing structures 357 are each formed, for example, of a threaded hole 357a, which is provided in the first block 352, and a screw 357b, which is inserted into the threaded hole 357a, as shown in FIG. 5. In the example shown in FIG. 5, the first fixing structures 357 are two first fixing structures 357.

The second block 354 is fixed to the support member 400 with second fixing structures 358. The second fixing structures 358 are each formed, for example, of a threaded hole 358a, which is provided in the second block 354, and a screw 358b, which is inserted into the threaded hole 358a.

In the example shown in FIG. 5, the second fixing structures 358 are two second fixing structures 358.

The distance L1 between the first fixing structures 357 and the second fixing structures 358 is greater than the distance L2 between the first corner 341 and the second corner 342. Therefore, even if the position of the second fixing structures 358 relative to the first fixing structures 357 deviates from a desired position, angular deviation of the first positioning member 350 can be smaller than in a case where the distance L1 is shorter than or equal to the distance L2. For example, even if the position of the second fixing structures 358 is shifted in the Y-axis direction, the angle of rotation of the first positioning member 350 around an axis parallel to the axis Z can be reduced. The distance L1 is the minimum distance between the first fixing structures 357 and the second fixing structures 358. The distance L2 is the distance between the vertex of the first corner 341 and the vertex of the second corner 342.

The connector 356 is, for example, a beam-shaped member that connects the block base 352a and the block base 354a to each other. In the example shown in FIG. 5, the connector 356 extends in the X-axis direction. The connector 356 may be in contact with the first atom cell container 340 or may be separate therefrom.

The second positioning member 360, for example, has the same shape of the first positioning member 350, as shown in FIGS. 5 and 6. The first atom cell container 340 has a third corner 343 and a fourth corner 344. In the example shown in FIGS. 5 and 6, the third corner 343 is a −X-axis-direction-side and −Y-axis-direction-side corner of the first atom cell container 340. The fourth corner 344 is a +X-axis-direction-side and −Y-axis-direction-side corner of the first atom cell container 340. The second positioning member 360 includes a third block 362, which is in contact with the third corner 343, a fourth block 364, which is in contact with the fourth corner 344, and a connector 366, which connects the third block 362 and the fourth block 364 to each other.

The third block 362 includes a block base 362a and block walls 362b and 362c. The fourth block 364 includes a block base 364a and block walls 364b and 364c. The block wall 362b is in contact with the −X-axis-direction-side outer surface 34b of the first atom cell container 340. The block walls 362c, 364b, and 364c may be in contact with the first atom cell container 340 or may be separate therefrom.

The third block 362 is fixed to the support member 400 with third fixing structures 367, as is the first block 352. The fourth block 364 is fixed to the support member 400 with fourth fixing structures 368, as is the second block 354.

The first positioning member 350 and the second positioning member 360 are each a thermally insulating member. The positioning members 350 and 360 are made, for example, of a resin material, such as an engineering plastic material, a liquid crystal polymer (LCP) resin, and polyether ether ketone (PEEK). The positioning members 350 and 360, which are each a thermally insulating member, suppress, for example, transfer of the heat of the heater unit 380 to the light source 120 via the support member 400. If the heat of the heater unit 380 transfers to the light source 120 via the support member 400, a desired temperature of the light source 120 cannot be achieved in some cases. The "thermally insulating member" is a member having a thermal conductivity of 1 W/mK or lower.

The spacers 369 are disposed between a +Z-axis-direction-side outer surface 34e of the first atom cell container 340 and the second atom cell container 370. The spacers 369 are formed, for example, of four spacers 369, as shown in FIG. 6. In the example shown in FIG. 6, the spacers 369 are disposed at the +Z-axis-direction-side corners of the first atom cell container 340. The material of the spacers 369 is, for example, the same material of the positioning members 350 and 360.

Figure 9:
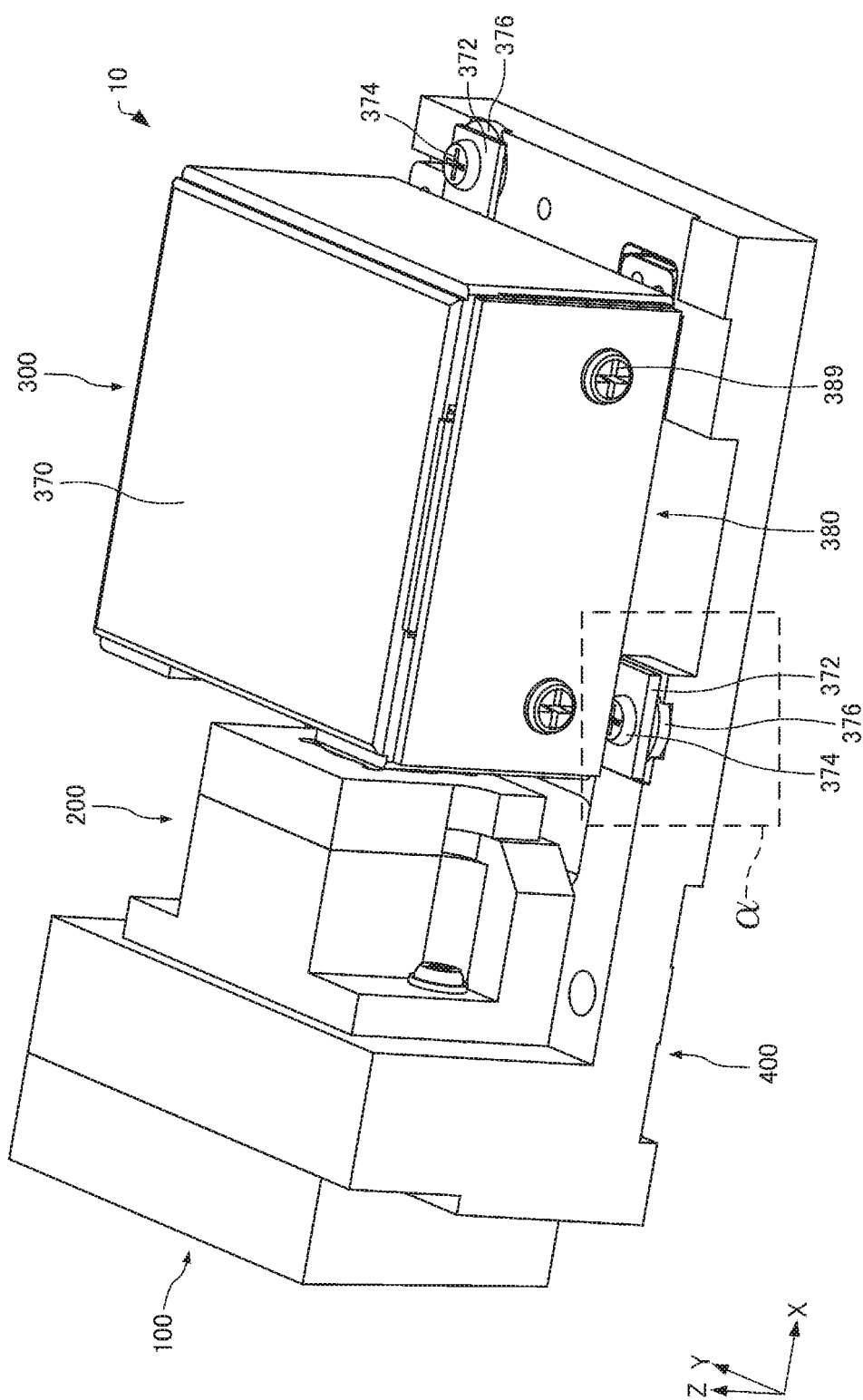
FIG. 9 is a perspective view diagrammatically showing the atomic oscillator according to the embodiment.
Figure 10:
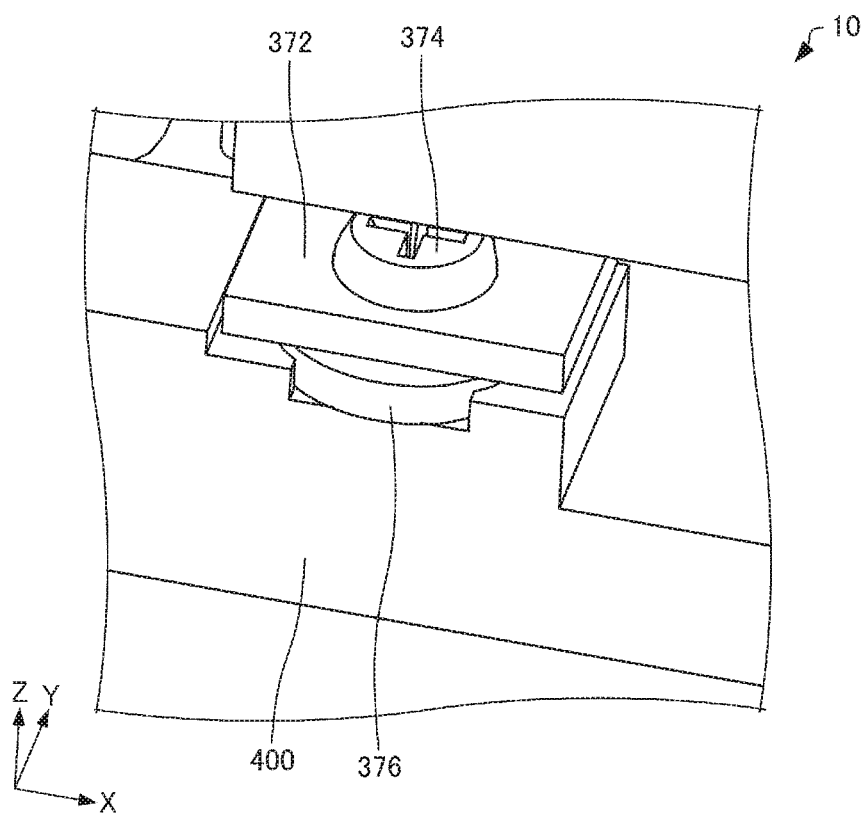
FIG. 10 is a perspective view diagrammatically showing the atomic oscillator according to the embodiment.

FIG. 9 is a perspective view diagrammatically showing the atomic oscillator 10 according to the present embodiment. FIG. 10 is an enlarged view of a region a shown in FIG. 9. In FIG. 9, part of the members of the atomic oscillator 10 is omitted for convenience.

The second atom cell container 370 accommodates the first atom cell container 340. In the example shown in FIG. 9, the second atom cell container 370 includes plate-shaped fixers 372 each provided with a through hole, and the fixers 372 are each fixed to the support member 400 with a screw 374. The second atom cell container 370 includes, for example, three fixers 372 and is therefore fixed to the support member 400 at three locations, as shown in FIG. 4.

The second atom cell container 370 is made, for example, of the same material of the first atom cell container 340. The second atom cell container 370 can shield external magnetism. Since the spacers 369 are disposed between the first atom cell container 340 and the second atom cell container 370, the first atom cell container 340 and the second atom cell container 370 are separate from each other. The function of shielding external magnetism can therefore be enhanced as compared, for example, with a case where the first atom cell container 340 and the second atom cell container 370 are in contact with each other. The atom cell containers 340 and 370 may be formed in a machining process.

The second atom cell container 370 is provided with a through hole 370a. The light LL emitted from the light source 120 passes through the through hole 370a and enters the atom cell 310. A member that transmits the light LL may be provided in the through hole 370a.

A thermally insulating member 376 is disposed between each of the fixers 372 of the second atom cell container 370 and the support member 400, as shown in FIG. 10. The thermally insulating members 372 can suppress transfer of the heat of the heater unit 380 to the light source 120 via the second atom cell container 370 and the support member 400. The thermally insulating members 376 may each be a washer. The thermally insulating members 376 are made, for example, of the same material of the positioning members 350 and 360.

The heater unit 380 is in contact with the heat transfer member 346, as shown in FIG. 4. The heater unit 380 includes a heating device 381, a heater container 382, thermally insulating members 386 and 387, a thermally insulating member 385, and screws 389.

The heating device 381 is disposed at the outer surface 34f of the first atom cell container 340. In the example shown in FIG. 4, the heating device 381 is disposed at the outer surface 34f of the first atom cell container 340 with the heating device 381 accommodated in the heater container 382. The heating device 381 is a device that heats the atom cell 310. Specifically, the heating device 381 is a device for heating the alkali metal atom in the first space 312. The heating device 381 is, for example, a heating resistor. The heating device 381 may be a Peltier device in place of a heating resistor or in addition thereto.

The heater container 382 accommodates the heating device 381. The heater container 382 includes a heater lid 383 and a heater base 384.

The heater lid 383 is disposed between the heating device 381 and the atom cell 310. In the example shown in FIG. 4, the heater lid 383 is shaped so as to have a recess in which the heating device 381 is disposed. The heater lid 383 is in contact with the heat transfer member 346. The heater lid 383 has through holes 383a, through which the screws 389 pass. The heater base 384 is disposed on the side opposite the atom cell 310 with respect to the heating device 381. In the example shown in FIG. 4, the heater base 384 has a plate shape. The heater base 384 has through holes 384a, through which the screws 389 pass.

The heater lid 383 and the heater base 384 are fixed to each other with the screws 389. Further, the heater container 382 is fixed to the second atom cell container 370 with the screws 389. In the example shown in FIG. 4, the screws 389 are two screws 389, and the heating device 381 is disposed between the two screws 389. The screws 389 are made, for example, of a metal.

The heater lid 383 and the heater base 384 are made, for example, of the same material of the first atom cell container 340. The heater lid 383 and the heater base 384 therefore shield magnetism. The heater container 382 can therefore shield magnetism produced by the heating device 381. An effect of the magnetism from the heating device 381 on the alkali metal atom in the atom cell 310 can therefore be suppressed, whereby stable oscillation characteristics of the atomic oscillator 10 can be achieved. The heater container 382 may be formed of an arbitrary number of members and may have an arbitrary shape as long as the heater container 382 can shield the magnetism produced by the heating device 381.

The thermally insulating members 385, 386, and 387 are disposed between the heater lid 383 and the heater base 384 and shifted from the heating device 381 toward the heater base 384. In the atomic oscillator 10, the plurality of thermally insulating members 385, 386, and 387 are thus disposed between the heater lid 383 and the heater base 384 and shifted from the heating device 381 toward the heater base 384. The thermally insulating members 385, 386, and 387 only need to be located so that at least part thereof is shifted from the heating device 381 toward the heater base 384. The thermally insulating members 385, 386, and 387 are made, for example, of the same material of the positioning members 350 and 360.

The thermally insulating member 385 is accommodated in the heater container 382. The thermally insulating member 385 is disposed on the side opposite the atom cell 310 with respect to the heating device 381. That is, the thermally insulating member 385 is disposed between the heating device 381 and the heater base 384. Transfer of the heat of the heating device 381 to the side opposite the atom cell 310 can thus be suppressed, whereby the heat of the heating device 381 can be efficiently transferred to the atom cell 310. The thermally insulating member 385 may instead be a film made of a thermally insulating material and deposited on the heater base 384.

The thermally insulating members 386 and 387 are disposed in the through holes 383a in the heater lid 383. The thermally insulating members 386 and 387 are each a washer having a first portion 388a, which is disposed between the heater lid 383 and the heater base 384, and a second portion 388b, which is disposed in the corresponding through hole 383a in the heater lid 383. The thermally insulating members 386 and 387 in the present embodiment each have a structure in which the first portion 388a and the second portion 388b are integrated with each other, but the first portion 388a and the second portion 388b may instead be components independent of each other. That is, a member corresponding to the first portion 388a and a member corresponding to the second portion 388b may be combined with each other. Still instead, only the member corresponding to one of the first portion 388a and the second portion 388b may be used.

The diameter of the first portions 388a is greater than the diameter of the through holes 383a in the heater lid 383, and the diameter of the second portions 388b is smaller than the diameter of the through holes 383a in the heater lid 383. That is, the diameter of the first portions 388a is greater than that of the second portions 388b. Further, the diameter of the first portions 388a is greater than the diameter of the through holes 384a in the heater base 384. The thermally insulating members 386 and 387 are each provided with a through hole through which the corresponding screw 389 passes. The length of the second portions 388b is greater than the thickness of the heater lid 383, in other words, the length of the through holes 383a in the heater lid 383. Further, the diameter of threaded holes which are provided in the second atom cell container 370 and through which the screws 389 pass is smaller than the diameter of the second portions 388b of the thermally insulating members 386 and 387.

Since the thermally insulating members 386 and 387, specifically, the first portions 388a can lower the possibility of contact between the heater lid 383 and the heater base 384, transfer of the heat produced by the heating device 381 and transferred to the heater lid 383 to the heater base 384 can be suppressed. Further, the second portions 388b can suppress transfer of the heat produced by the heating device 381 and transferred to the heater lid 383 to the heater base 384 via the screws 389. The heat of the heating device 381 can thus be efficiently transferred to the atom cell 310. Further, since the length of the second portions 388b is greater than the thickness of the heater lid 383, contact between the heater lid 383 and the second atom cell container 370 can be avoided. Since the diameter of the threaded holes which are provided in the second atom cell container 370 and through which the screws 389 pass is smaller than the diameter of the second portions 388b of the thermally insulating members 386 and 387, the configuration can also prevent contact between the heater lid 383 and the second atom cell container 370. Transfer of the heat produced by the heating device 381 and transferred to the heater lid 383 to the second atom cell container 370 can therefore be suppressed. In the example shown in FIG. 4, the thermally insulating member 386 is disposed on the +X-axis-direction side of the thermally insulating member 385, and the thermally insulating member 387 is disposed on the −X-axis-direction side of the thermally insulating member 385.

Although not shown in FIGS. 2 to 4, the temperature sensor 322 is disposed in the vicinity of the atom cell 310. The temperature sensor 322 is, for example, a thermistor, a thermocouple, or any of a variety of other temperature sensors.

Although not shown in FIGS. 2 to 4, the coil 324 is, for example, a solenoid-type coil in which a wire is wound along the outer circumference of the atom cell 310 or a pair of Helmholtz-type coils that face each other with the atom cell 310 therebetween. The coil 324 produces a magnetic field in the atom cell 310 and in the direction along the optical axis A of the light LL. The magnetic field enlarges, based on Zeeman splitting, the gap between the degenerated different energy levels of the alkali metal atom accommodated in the atom cell 310 for improvement in the resolution and reduction in the linewidth of the EIT signal.

Although not shown, a flexible substrate including wiring for externally supplying the heating device 381 with electric power may be disposed on the side opposite the heating device 381 with respect to the thermally insulating member 385. Transfer of the heat of the heating device 381 to the flexible substrate can thus be suppressed, whereby the heat of the heating device 381 can be efficiently transferred to the atom cell 310.

The Peltier device 390 is disposed in the second atom cell container 370, as shown in FIG. 2. In the example shown in FIG. 2, the Peltier device 390 is disposed on the +Z-axis-direction-side outer surface of the second atom cell container 370. The Peltier device 390 is controlled by the temperature controller 510 so as to transfer the heat from the second atom cell container 370 to an outer lid 620 of the outer container 600. The temperature controller 510 may control the Peltier device 390 based on the result of detection performed by a temperature sensor (not shown).

A heat transfer member 392 is disposed between the Peltier device 390 and the outer lid 620 of the outer container 600. The thermal conductivity of the heat transfer member 392 is, for example, higher than the thermal conductivity of the outer lid 620. The heat transfer member 392 has, for example, a plate shape of a sheet shape. The heat transfer member 392 is made, for example, of aluminum, titanium, copper, or highly heat-dissipative silicone. The heat transfer member 392 transfers the heat dissipated via a heat dissipating surface of the Peltier device 390 to the outer lid 620.

The support member 400 is fixed in the form of a cantilever to the outer base 610 of the outer container 600, as shown in FIG. 2. The support member 400 is fixed, for example, to a mount seat 611 of the outer base 610 with two screws 602, as shown in FIG. 3. The support member 400 has a fixed end 402 and a free end 404. In the example shown in FIG. 2, the support member 400 has a −X-axis-direction-side end, which is the fixed end 402, and a +X-axis-direction-side end, which is the free end (end portion) 404. An air gap 6 is present between the outer base 610 and the portion of the support member 400 other than the fixed portion, that is, the portion other than the fixed end 402 in the present embodiment. That is, the air gap 6 is present between the free end 404 and the outer base 610. The support member 400 may be made, for example, of aluminum or copper, or the support member 400 may be formed, for example, of a carbon sheet containing carbon fibers. The support member 400 may instead be fixed to the outer base 610 with an adhesive.

Figure 11:
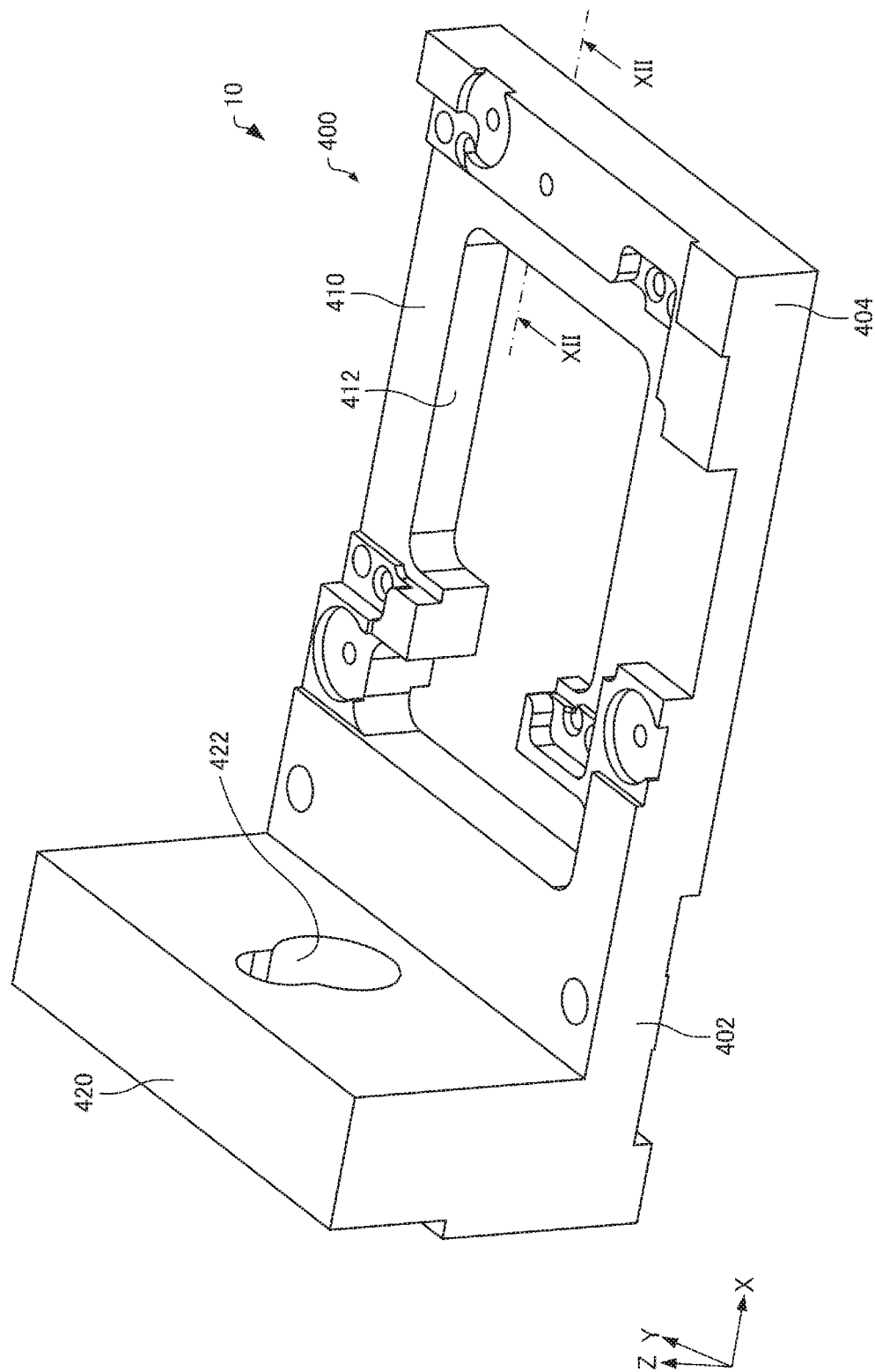
FIG. 11 is a perspective view diagrammatically showing a support member of the atomic oscillator according to the embodiment.

FIG. 11 is a perspective view diagrammatically showing the support member 400. The support member 400 includes an atom cell support 410, which faces the outer base 610, and a light source support 420, which is located along the +Z-axis direction with respect to the atom cell support 410. The atom cell support 410 is provided with a through hole 412, which passes through the atom cell support 410 in the Z-axis direction, and the atom cell support 410 has a frame shape when viewed in the Z-axis direction. The light source support 420 is provided with a through hole 422, which passes through the light source support 420 in the X-axis direction. The light source support 420 is disposed on the side facing the fixed end 402 of the support member 400.

The light source unit 100, the optical system unit 200, and the atom cell unit 300 are disposed on the support member 400, as shown in FIGS. 2 and 3.

The light source unit 100 is disposed on the side facing one of the fixed end 402 and the free end 404 of the support member 400, that is, on the side facing the fixed end 402. The light source unit 100 is fixed to the −X-axis-direction-side surface of the light source support 420, for example, with screws (not shown) in such a way that the light source container 140 is located in the through hole 422. In the example shown in the drawings, the light source 120 is disposed on the side facing the fixed end 402 of the support member 400 via the light source container 140 and the light source substrate 150. The optical system unit 200 is fixed to the +X-axis-direction-side surface of the light source support 420, for example, with screws (not shown).

The atom cell unit 300 is disposed on the side facing one of the fixed end 402 and the free end 404 of the support member 400, that is, on the side facing the free end 404. The atom cell unit 300 is disposed on the side facing the free end 404 so as to overlap with the through hole 412 when viewed in the Z-axis direction. In the example shown in the drawings, the atom cell unit 300 is fixed to the atom cell support 410 with the screws 374. In the example shown in the drawings, the atom cell 310 is disposed on the side facing the free end 404 of the support member 400 via the first holding member 330, the first atom cell container 340, the positioning members 350 and 360, and the second atom cell container 370.

The configuration described above in which the support member 400 is fixed in the form of a cantilever to the outer base 610 can suppress deformation of the support member 400 due, for example, to stress resulting from the difference in the coefficient of thermal expansion between the support member 400 and the outer base 610. If the support member 400 is fixed to the outer base 610 with the two ends of the support member 400 fixed thereto, the support member 400 is deformed in some cases due to the stress resulting from the difference in the coefficient of terminal expansion between the two components.

Figure 12:
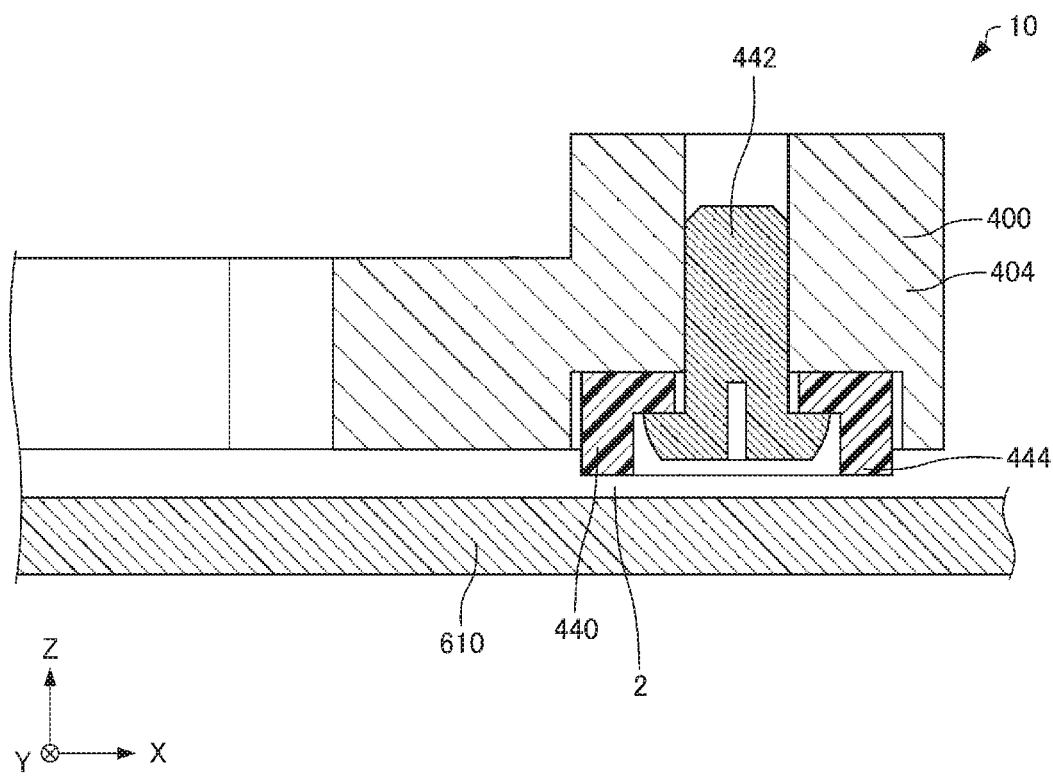
FIG. 12 is a cross-sectional view diagrammatically showing the atomic oscillator according to the embodiment.

The atomic oscillator 10 includes a protrusion 440, which is disposed in the support member 400. FIG. 12 is a cross-sectional view diagrammatically showing the support member 400, the protrusion 440, a screw 442, and the outer base 610 and is a cross-sectional view taken along the line XII-XII in FIG. 11.

The protrusion 440 is disposed on the side facing the free end 404 of the support member 400, as shown in FIGS. 2 and 12. The protrusion 440 is disposed in a surface of the support member 400 that is the surface facing the outer base 610 and protrudes beyond the surface toward the outer base 610. In the example shown in FIG. 12, the protrusion 440 is fixed to the support member 400 with the screw 442. The protrusion 440 may be a washer.

In a case where the support member 400 bends toward the outer base 610 and the free end 404 therefore approaches the outer base 610, the protrusion 440 comes into contact with the outer base 610 before the support member 400 does. The protrusion 440 can therefore suppress deformation of the support member 400, for example, even when force in the Z-axis direction externally acts on the atomic oscillator 10. As long as the position of the protrusion 440 is closer to the free end 404 than to the fixed end 402, appropriately designing the height of the protrusion 440 can suppress deformation of the support member 400. The protrusion 440 does not necessarily have a specific shape and may, for example, have a rod shape.

In the example shown in the drawings, the light source unit 100 is disposed on the side facing one of the fixed end 402 and the free end 404 of the support member 400, that is, on the side facing the fixed end 402, and the atom cell unit 300 is disposed on the side facing one of the fixed end 402 and the free end 404 of the support member 400, that is, on the side facing the free end 404. The protrusion 440 can therefore suppress the amount of shift of the atom cell 310 with respect to the light source 120.

An air gap 2 is present between the protrusion 440 and the outer base 610. At least a facing portion 444, which is a portion of the protrusion 440 and faces the outer base 610, is made of a thermally insulating material. Specifically, the protrusion 440 is a thermally insulating member and is made, for example, of the same material of the positioning members 350 and 360. The fact that the facing portion 444 of the protrusion 440 is made of a thermally insulating material can suppress, even when the protrusion 440 comes into contact with the outer base 610, transfer of the heat of the heater unit 380 to the outer base 610 via the second atom cell container 370, the support member 400, and the protrusion 440. If the heat of the heater unit 380 transfers to the outer base 610 via the protrusion 440, the heat of the heater unit 380 transfers to the light source 120, and a desired temperature of the light source 120 cannot be achieved in some cases. Although not shown, the facing portion 444 may be made of a thermally insulating material, and the portion of the protrusion 440 other than the facing portion 444 may be made of a material having high thermal conductivity. Still instead, the protrusion 440 may not be made of a thermally insulating material.

The control unit 500 includes a circuit substrate 502, as shown in FIG. 2. The circuit substrate 502 is fixed to the outer base 610 via a plurality of lead pins 504. An integrated (IC) chip that is not shown is disposed on the circuit substrate 502, and the IC chip functions as the temperature controller 510, the light source controller 520, the magnetic field controller 530, and the temperature controller 540. The IC chip is electrically connected to the light source unit 100 and the atom cell unit 300. The circuit substrate 502 is provided with a through hole 503, through which the support member 400 is inserted.

The outer container 600 accommodates the light source unit 100, the optical system unit 200, the atom cell unit 300, the support member 400, the protrusion 440, and the control unit 500. The outer container 600 includes the outer base (first member) 610 and the outer lid (second member) 620, which is a component separate from the outer base 610. The outer base 610 may be referred to as a container substrate 610 or a substrate 610, and the outer lid 620 may be referred to as a container lid 620 or a lid 620. The outer container 600 is made, for example, of the same material of the first atom cell container 340. The outer container 600 can therefore shield external magnetism, whereby an effect of external magnetism on the alkali metal atom in the atom cell 310 can be suppressed.

The outer container 600 has a first outer container surface (first surface) 612 and a second outer container surface (second surface) 622 different from the first outer container surface 612. Specifically, the outer base 610 has the first outer container surface 612, and the outer lid 620 has the second outer container surface 622.

In the example shown in FIG. 2, the first outer container surface 612 is a surface that forms the outer base 610 and is oriented in the +Z-axis direction, and the direction of the perpendicular P to the first outer container surface 612 is the Z-axis direction. The first outer container surface 612 has a first region 612a, which is the upper surface of the mount seat 611, and a second region 612b and a third region 612c, which are disposed so as to sandwich the first region 612a when viewed in the Z-axis direction. The support member 400 is disposed on the first outer container surface 612. The second outer container surface 622 is a surface facing the first outer container surface 612. In the example shown in FIG. 2, the second outer container surface 622 is a surface that forms the outer lid 620 and is oriented in the −Z-axis direction.

The light source unit 100 is mounted to the first outer container surface 612. In the example shown in FIG. 2, the light source unit 100 is mounted to the first outer container surface 612 via the support member 400 and a heat transfer member 614. The term "mounted" includes a case where a member A and a member B (or surface B) are directly mounted to each other and a case where the member A and the member B are indirectly mounted to each other via a member C. The heat transfer member 614 is provided between the support member 400 and the first outer container surface 612. The heat transfer member 614 has, for example, a plate shape or a sheet shape. The thermal conductivity of the heat transfer member 614 is higher than the thermal conductivity of the support member 400 and the thermal conductivity of the outer base 610. The heat transfer member 614 is made, for example, of aluminum, titanium, copper, or highly heat-dissipative silicone.

An air gap 4 is present between the light source unit 100 and the second outer container surface 622. That is, the light source unit 100 is disposed so as to be separate from the second outer container surface 622. In other words, the light source unit 100 is not mounted to the second outer container surface 622.

The atom cell unit 300 is mounted to the second outer container surface 622. In the example shown in FIG. 2, the atom cell unit 300 is mounted to the second outer container surface 622 via the heat transfer member 392. The atom cell 310 is mounted to the outer lid 620. In the example shown in the drawings, the atom cell 310 is mounted to the outer lid 620 via the holding members 330 and 332, the first atom cell container 340, the spacers 369, the Peltier device 390, and the heat transfer member 392.

An air gap 6 is present between the atom cell unit 300 and the first outer container surface 612. That is, the atom cell unit 300 is disposed so as to be separate from the first outer container surface 612.

In the example shown in the drawings, the light source unit 100 is mounted to the outer container 600 only via the first outer container surface 612, and the atom cell unit 300 is mounted to the outer container 600 only via the second outer container surface 622. As long as the light source unit 100 and the atom cell unit 300 are not mounted to the same surface, the light source unit 100 and the outer container 600 may not be mounted to each other only via the first outer container surface 612, or the atom cell unit 300 and the outer container 600 may not be mounted to each other only via the second outer container surface 622. For example, the light source unit 100 and the outer container 600 may be mounted to each other via a surface different from the first outer container surface 612 and the second outer container surface 622 in addition to the first outer container surface 612. Further, the atom cell unit 300 and the outer container 600 may be mounted to each other via a surface different from the first outer container surface 612 and the second outer container surface 622 in addition to the second outer container surface 622.

Since the light source unit 100 is mounted to the first outer container surface 612 but is separate from the second outer container surface 622, and the atom cell unit 300 is mounted to the second outer container surface 622 but is separate from the first outer container surface 612, the heat of the light source unit 100 (specifically, heat of Peltier device 110) can be dissipated out of the outer base 610 having the first outer container surface 612, and the heat of the atom cell unit 300 (specifically, heat of heater unit 380) can be dissipated out of the outer lid 620 having the second outer container surface 622. Transfer of the heat of the light source unit 100 to the atom cell 310 and transfer of the heat of the atom cell unit 300 to the light source 120, for example, via the outer base 610 can therefore be suppressed.

First thermal resistance along the path between the light source unit 100 and the atom cell unit 300 via the support member 400 is higher than second thermal resistance between the light source unit 100 and the first outer container surface 612 and third thermal resistance between the atom cell unit 300 and the second outer container surface 622. The second thermal resistance is, for example, the thermal resistance along the path between the light source unit 100 and the first outer container surface 612 via the support member 400. The third thermal resistance is, for example, the thermal resistance along the path between the atom cell unit 300 and the second outer container surface 622 via the heat transfer member 392.

The thermal resistance represents how difficult the temperature transfers. Thermal resistance R (K/W) of a member is in general calculated by $R=L/(\lambda \cdot S)$, where $\lambda$ (W/m·K) represents the thermal conductivity of the member, S (m$^2$) represents the cross-sectional area of the member, and L (m) represents the length of the member, and provided that a temperature difference $\Delta T$ occurs along the length of the member. In a case where the member has a complicated shape or a case where the member is formed of a large number of parts, composite thermal resistance can be roughly calculated by a thermal simulation. For example, in a simulation using a model formed of the light source unit 100, the atom cell unit 300, the support member 400, and the outer container surfaces 612 and 622, the magnitudes of the first, second, third thermal resistance can be grasped by heating the light source unit 100 and the atom cell unit 300 and determining the temperatures of the support member 400 and the outer container surfaces 612 and 622.

The support member 400 is provided with the through hole 412, as described above. The through hole 412 causes the portion of the atom cell support 410 and between the portion where the atom cell unit 300 is disposed and the light source support 420 to be narrow, that is, to have a small cross-sectional area. The first thermal resistance can thus be increased. Further, the atom cell unit 300 is disposed so as to overlap with the through hole 412 when viewed in the Z-axis direction. That is, a larger air gap is present between the atom cell unit 300 and the first outer container surface 612 than in a case where no through hole 412 is present. The heat transfer between the atom cell unit 300 and the first outer container surface 612 can therefore be suppressed as compared with the case where no through hole 412 is present.

Figure 13:
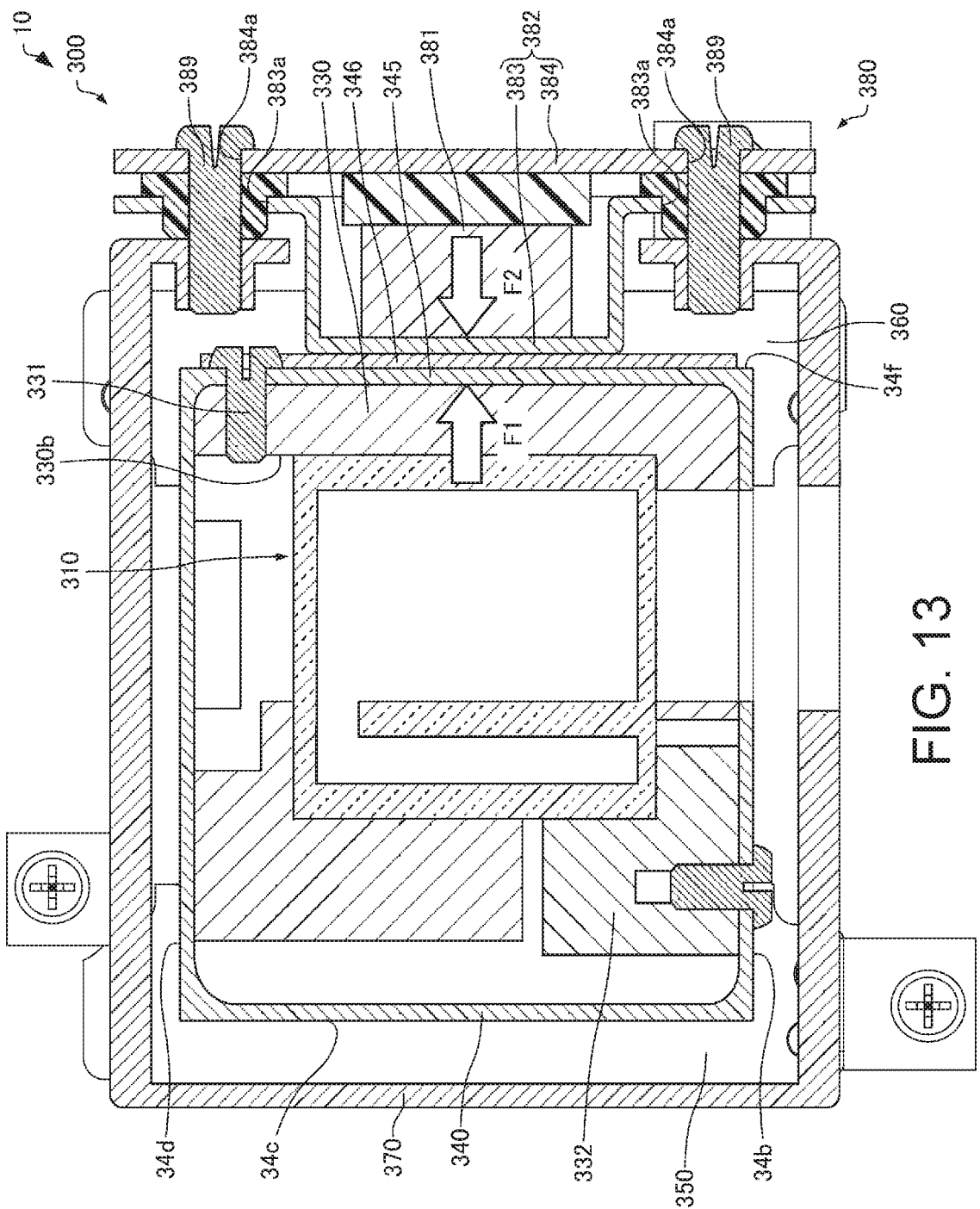
FIG. 13 illustrates the positioning of an atom cell with respect to a support member.

FIG. 13 illustrates the positioning of the atom cell 310 with respect to the support member 400.

The atom cell 310 is pressed against the first atom cell container 340 toward the heating device 381 (see arrow F1 in FIG. 13). In the example shown in FIG. 13, the atom cell 310 is pressed against the wall 345 of the first atom cell container 340 in the −Y-axis direction. The atom cell 310 is held by the first holding member 330, and the first holding member 330 is pressed against the first atom cell container 340 toward the heating device 381. As described above, in the example shown in FIG. 13, the first holding member 330, which holds the atom cell 310, is pressed, and the atom cell 310 is in turn pressed.

The atom cell 310 is fixed to the first atom cell container 340 with the screw 331. In the example shown in FIG. 13, the first holding member 330, which holds the atom cell 310, is fixed to the first atom cell container 340 with the screw 331. The atom cell 310 is thus fixed to the first atom cell container 340.

Since the atom cell 310 is thus fixed to the first atom cell container 340 with the screw 331, the atom cell 310 is pressed against the first atom cell container 340 toward the heating device 381. In the example shown in FIG. 13, since the first holding member 330 is fixed to the first atom cell container 340 with the screw 331, the first holding member 330 is pressed against the first atom cell container 340 toward the heating device 381.

Specifically, when the screw 331 caused to pass through a through hole in the first atom cell container 340 is threaded and fastened into a threaded hole in the first holding member 330, force that fastens the first atom cell container 340 to the first holding member 330 (fastening force) is produced, whereby the first atom cell container 340 is fastened to the first holding member 330. The fastening force causes the first holding member 330, that is, the atom cell 310 to be pressed against the first atom cell container 340 toward the heating device 381.

The heating device 381 is pressed against the first atom cell container 340 toward the atom cell 310 (see arrow F2 in FIG. 13). In the example shown in FIG. 13, the heating device 381 is pressed in the +Y-axis direction against the wall 345 of the first atom cell container 340. The heating device 381 is held in the heater container 382, and the heater container 382 is pressed against the first atom cell container 340 toward the atom cell 310. As described above, in the example shown in FIG. 13, the heater container 382, which holds the heating device 381, is pressed, and the heating device 381 is in turn pressed.

The heating device 381 is fixed to the second atom cell container 370, which accommodates the first atom cell container 340, with the screws 389. In the example shown in FIG. 13, the heater container 382, which holds the heating device 381, is fixed to the second atom cell container 370 with the screws 389. The heating device 381 is thus fixed to the second atom cell container 370.

When the heating device 381 is fixed to the second atom cell container 370 with the screws 389, the heating device 381 is pressed against the first atom cell container 340 toward the atom cell 310. In the example shown in FIG. 13, when the heater container 382 is fixed to the second atom cell container 370 with the screws 389, the heater container 382 is pressed against the first atom cell container 340 toward the atom cell 310.

Specifically, when the screws 389 caused to pass through the through holes 383a and 384a in the heater container 382 are threaded and fastened into threaded holes in the second atom cell container 370, force that fastens the heater container 382 to the second atom cell container 370 (fastening force) is produced, whereby the heater container 382 is fastened to the second atom cell container 370. The fastening force causes the heater container 382, that is, the heating device 381 to be pressed against the first atom cell container 340 toward the atom cell 310.

The heating device 381 is pressed against the first atom cell container 340 toward the atom cell 310, and the first atom cell container 340 is in turn pressed against the first positioning member 350. In the example shown in the drawings, the first atom cell container 340 has the outer surface 34f, on which the heating device 381 is disposed, and the outer surface 34c, which is located on the side opposite the outer surface 34f with respect to the atom cell 310, and the outer surface 34c is pressed against the block walls 352c and 354*c* (see FIGS. 5 and 7) of the first positioning member 350. When the first atom cell container 340 is pressed against the first positioning member 350, the first holding member 330, that is, the atom cell 310 is positioned with respect to a reference surface that is formed of the surfaces which form the block walls 352*c* and 354*c* and against which the outer surface 34*c* is pressed. The atom cell 310 can therefore be disposed with respect to the support member 400 with high positional precision.

Further, the atom cell 310 is pressed against the first atom cell container 340 toward the heating device 381 (see arrow F1 in FIG. 13), and the heating device 381 is pressed against the first atom cell container 340 toward the atom cell 310 (see arrow F2 in FIG. 13), as described above. The atom cell 310 can therefore be efficiently heated.

The atomic oscillator 10 has, for example, the following features.

In the atomic oscillator 10, the light source unit 100 and the first outer container surface 612 are mounted to each other with the air gap 4 present between the light source unit 100 and the second outer container surface 622, and the atom cell unit 300 and the second outer container surface 622 are mounted to each other with the air gap 6 present between the atom cell unit 300 and the first outer container surface 612. Therefore, in the atomic oscillator 10, transfer of the heat of the light source unit 100 (specifically, heat of Peltier device 110) to the atom cell 310 and transfer of the heat of the atom cell unit 300 (specifically, heat of heater unit 380) to the light source 120 via the outer container 600 can be suppressed as compared with a case where the light source unit 100 and the atom cell unit 300 are mounted to the same surface of the outer container 600. As described above, in the atomic oscillator 10, thermal interference between the light source unit 100 and the atom cell unit 300 can be suppressed. Therefore, in the atomic oscillator 10, unstableness of the temperatures of the light source 120 and the atom cell 310 can be suppressed, whereby desired temperatures of the light source 120 and the atom cell 310 can, for example, be achieved. As a result, the atomic oscillator 10 is allowed to have high frequency stability. Further, the temperatures of the light source 120 and the atom cell 310 can be readily controlled.

In the atomic oscillator 10, the first outer container surface 612 and the second outer container surface 622 face each other. Therefore, in the atomic oscillator 10, the heat of the light source unit 100 and the heat of the atom cell unit 300 can be transferred in opposite directions, whereby transfer of the heat of the light source unit 100 to the atom cell 310 and transfer of the heat of the atom cell unit 300 to the light source 120 can be more reliably suppressed.

In the atomic oscillator 10, the outer container 600 includes the outer base 610, which has the first outer container surface 612, and the outer lid 620, which has the second outer container surface 622 and is a component separate from the outer base 610. Therefore, in the atomic oscillator 10, heat is unlikely to transfer between the first outer container surface 612 and the second outer container surface 622, as compared, for example, with a case where one member has both the first outer container surface 612 and the second outer container surface 622. Therefore, in the atomic oscillator 10, transfer of the heat of the light source unit 100 to the atom cell 310 and transfer of the heat of the atom cell unit 300 to the light source 120 via the outer container 600 can be more reliably suppressed.

In the atomic oscillator 10, the first thermal resistance along the path between the light source unit 100 and the atom cell unit 300 via the support member 400 is higher than the second thermal resistance between the light source unit 100 and the first outer container surface 612 and the third thermal resistance between the atom cell unit 300 and the second outer container surface 622. Therefore, in the atomic oscillator 10, transfer of the heat of the light source unit 100 to the atom cell 310 and transfer of the heat of the atom cell unit 300 to the light source 120 via the support member 400 can be suppressed, as compared, for example, with a case where the first thermal resistance is lower than the second thermal resistance and the third thermal resistance.

In the atomic oscillator 10, the heat transfer member 614 is disposed between the support member 400 and the first outer container surface 612. Therefore, in the atomic oscillator 10, heat is allowed to readily transfer between the support member 400 and the outer container 600 having the first outer container surface 612.

In the atomic oscillator 10, the second atom cell container 370 accommodates the atom cell 310, and the thermally insulating members 376 are disposed between the second atom cell container 370 and the support member 400. Therefore, in the atomic oscillator 10, heat is unlikely to transfer between the second atom cell container 370 and the support member 400. Therefore, in the atomic oscillator 10, transfer of the heat of the light source unit 100 to the atom cell 310 and transfer of the heat of the atom cell unit 300 to the light source 120 via the outer container 600 can be more reliably suppressed.

In the atomic oscillator 10, the light source unit 100 is mounted to the outer container 600 only via the first outer container surface 612, and the atom cell unit 300 is mounted to the outer container 600 only via the second outer container surface 622. Therefore, in the atomic oscillator 10, transfer of the heat of the light source unit 100 to the atom cell 310 and transfer of the heat of the atom cell unit 300 to the light source 120 via the outer container 600 can be more reliably suppressed, as compared with a case where the light source unit 100 or the atom cell unit 300 is mounted to the outer container 600 also via another surface.

The atomic oscillator 10 includes the protrusion 440, which is disposed in a position closer to the free end 404 than to the fixed end 402 of the support member 400 and protrudes toward the outer base 610. Therefore, in the atomic oscillator 10, when force externally acts on the atomic oscillator 10 and the support member 400 therefore bends, the protrusion 440 comes into contact with the outer base 610. Therefore, in the atomic oscillator 10, the deformation of the support member 400 can be suppressed as compared with a case where no protrusion 440 is disposed. In other words, the amount of deformation of the support member 400 can be reduced as compared with the case where no protrusion 440 is disposed. As a result, in the atomic oscillator 10, deterioration in the positional relationship between the light source 120 and the atom cell 310 can be suppressed.

In the atomic oscillator 10, the protrusion 440 comes into contact with the outer base 610 before the support member 400 does when the support member 400 bends so that the free end 404 approaches the outer base 610. Therefore, in the atomic oscillator 10, the deformation of the support member 400 can be suppressed as compared with the case where no protrusion 440 is disposed.

In the atomic oscillator 10, the air gap 2 is present between the protrusion 440 and the outer base 610. Therefore, in the atomic oscillator 10, heat transfer, for example, from the support member 400 and the protrusion 440 to the outer base 610 can be suppressed. The temperature of the atom cell 310 or the light source 120 is therefore likely to be stable as compared with a case where no air gap is present between the protrusion 440 and the outer base 610.

In the atomic oscillator 10, at least the facing portion 444, which is part of the protrusion 440 and faces the outer base 610, is made of a thermally insulating material. Therefore, in the atomic oscillator 10, even when the protrusion 440 comes into contact with the outer base 610, heat transfer, for example, between the protrusion 440 and the outer base 610 can be suppressed.

In the atomic oscillator 10, the light source 120 is disposed on the side facing one of the fixed end 402 and the free end 404 of the support member 400, that is, on the side facing the fixed end 402, and the atom cell 310 is disposed on the side facing one of the fixed end 402 and the free end 404 of the support member 400, that is, on the side facing the free end 404. Therefore, in the atomic oscillator 10, even when the support member 400 bends, the protrusion 440 can suppress shift of the atom cell 310 with respect to the light source 120.

In the atomic oscillator 10, the atom cell 310 is mounted to the outer lid 620. Therefore, in the atomic oscillator 10, for example, even when force acts on the outer lid 620, and the support member 400, on which the atom cell 310 is disposed, therefore bends, the protrusion 440 can suppress deformation of the support member 400.

Further, in the atomic oscillator 10, the force that is produced by the free end 404 of the support member 400 and presses the atom cell 310 against the outer lid 620 can more reliably mount the atom cell 310 to the outer lid 620. Therefore, in the atomic oscillator 10, the heat of the heater unit 380 can more reliably transfer to the outer lid 620.

2. Variations of Atomic Oscillator 2.1. First Variation

Figure 14:
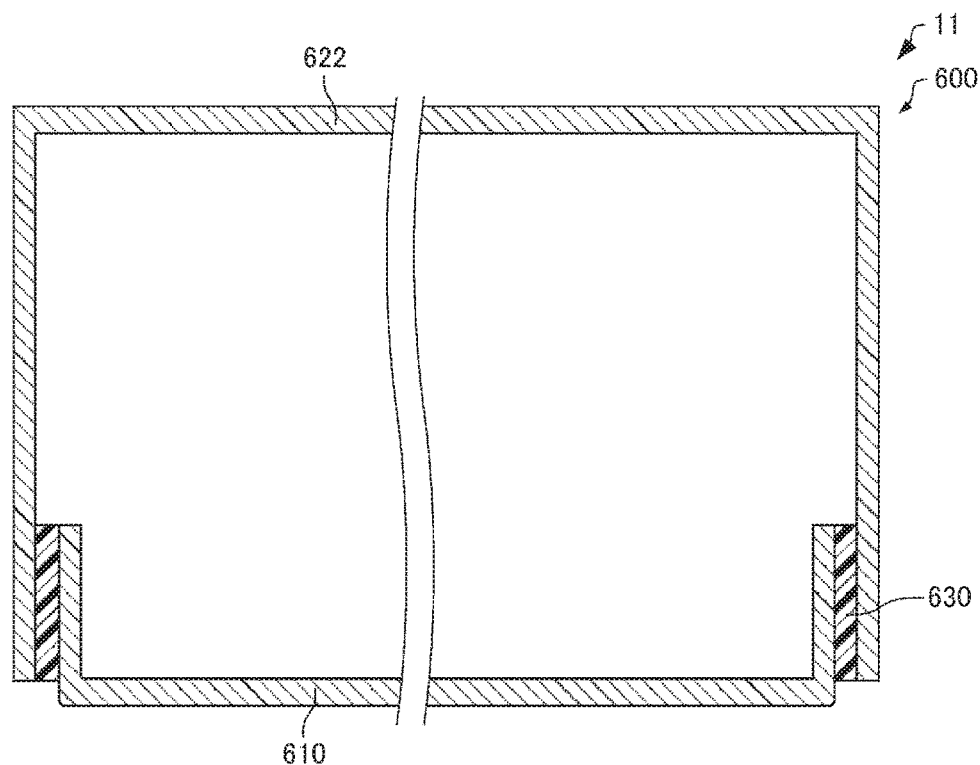
FIG. 14 is a cross-sectional view diagrammatically showing an atomic oscillator according to a first variation of the embodiment.

An atomic oscillator according to a first variation of the present embodiment will be described next with reference to the drawings. FIG. 14 is a cross-sectional view diagrammatically showing an atomic oscillator 11 according to the first variation of the present embodiment. In FIG. 14, members excluding the outer container 600 and a low thermal conductivity member 630 are omitted for convenience.

The atomic oscillator 11 according to the first variation of the present embodiment will be described about points different from those in the case of the atomic oscillator 10 according to the present embodiment described above, and the same points will not be described. The same holds true for atomic oscillators according to second, third, fourth, fifth, sixth, and seventh variations of the present embodiment that will be described later.

The atomic oscillator 11 differs from the atomic oscillator 10 described above in that a low thermal conductivity member (third member or insert) 630, the thermal conductivity of which is lower than those of the outer base 610 and the outer lid 620 of the outer container 600, is provided between the outer base 610 and the outer lid 620, as shown in FIG. 14.

The outer base 610 and the outer lid 620 may be bonded to each other via the low thermal conductivity member 630. Examples of the low thermal conductivity member 630 may include a resin film, a resin-based adhesive formed of a resin solved in a solvent, and solder.

In the atomic oscillator 11, the low thermal conductivity member 630, the thermal conductivity of which is lower than those of the outer base 610 and the outer lid 620, is provided between the outer base 610 and the outer lid 620, as described above. Therefore, in the atomic oscillator 11, heat is unlikely to transfer between the outer base 610 and the outer lid 620. As a result, in the atomic oscillator 11, transfer of the heat of the light source unit 100 to the atom cell 310 and transfer of the heat of the atom cell unit 300 to the light source 120 via the outer container 600 can be more reliably suppressed.

2.2. Second Variation

Figure 15:
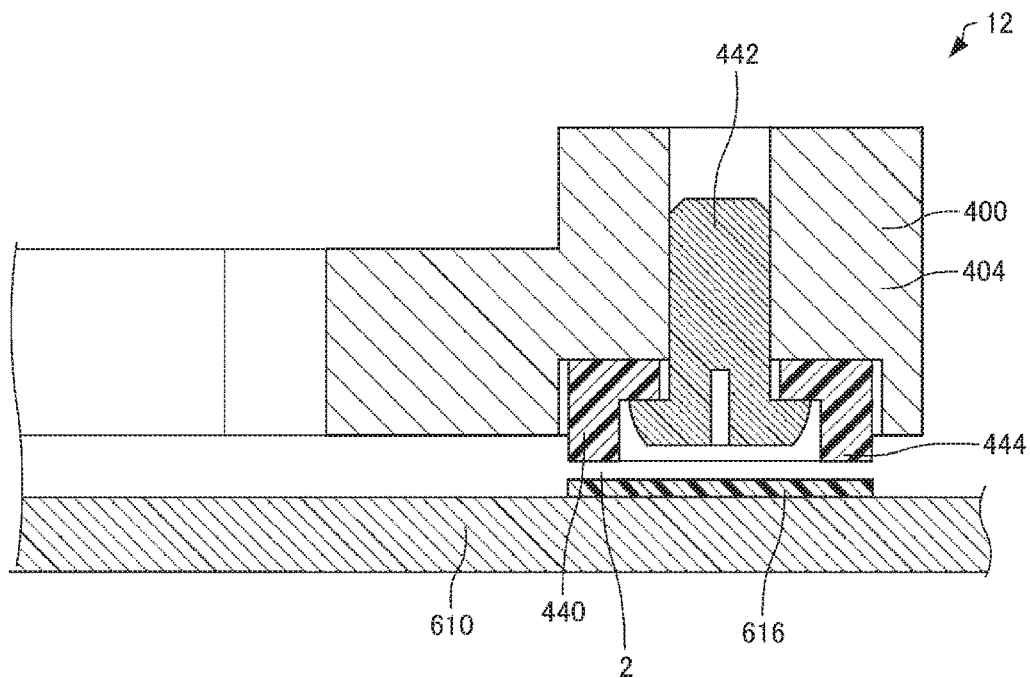
FIG. 15 is a cross-sectional view diagrammatically showing an atomic oscillator according to a second variation of the embodiment.

An atomic oscillator according to a second variation of the present embodiment will be described next with reference to the drawings. FIG. 15 is a cross-sectional view diagrammatically showing an atomic oscillator 12 according to the second variation of the present embodiment. In FIG. 15, members excluding the support member 400, the protrusion 440, the screw 442, and the outer base 610 are omitted for convenience.

In the atomic oscillator 12, at least a facing portion 616, which is part of the outer base 610 and faces the protrusion 440, is made of a thermally insulating material, as shown in FIG. 15. Specifically, the material of the facing portion 616 is the same material of the positioning members 350 and 360.

In the atomic oscillator 12, at least the facing portion 616, which is part of the outer base 610 and faces the protrusion 440, is made of a thermally insulating material. Therefore, even when the protrusion 440 comes into contact with the outer base 610, transfer of the heat of the heater unit 380, for example, to the outer base 610 via the protrusion 440 can be more reliably suppressed. Although not shown, the facing portion 616 and the portion of the outer base 610 other than the facing portion 616 may be made of a thermally insulating material. Still instead, the facing portion 444 of the protrusion 440 and the facing portion 616 of the outer base 610 may be made of a thermally insulating material or only one of the facing portions be made of a thermally insulating material.

2.3. Third Variation

Figure 16:
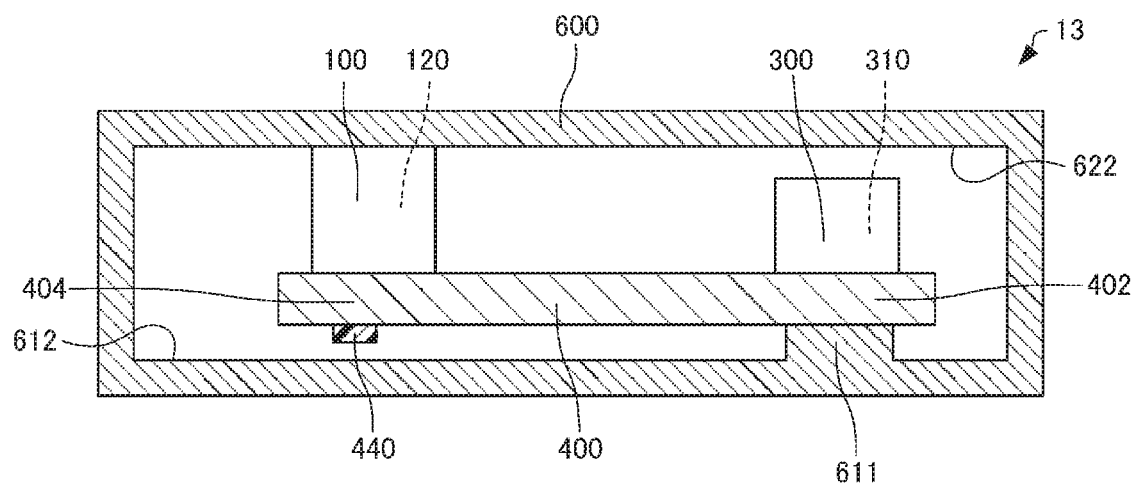
FIG. 16 is a cross-sectional view diagrammatically showing an atomic oscillator according to a third variation of the embodiment.

An atomic oscillator according to a third variation of the present embodiment will be described next with reference to the drawings. FIG. 16 is a cross-sectional view diagrammatically showing an atomic oscillator 13 according to the third variation of the present embodiment. In FIG. 16, members excluding the light source unit 100, the atom cell unit 300, the support member 400, the protrusion 440, and the outer container 600 are omitted and each of the members described above is drawn in a simplified form for convenience.

In the atomic oscillator 10 described above, the light source unit 100 is disposed on the side facing one of the fixed end 402 and the free end 404 of the support member 400, that is, on the side facing the fixed end 402, and the atom cell unit 300 is disposed on the side facing one of the fixed end 402 and the free end 404 of the support member 400, that is, on the side facing the free end 404, as shown in FIG. 2.

In contrast, in the atomic oscillator 13, the atom cell unit 300 is disposed on the side facing one of the fixed end 402 and the free end 404 of the support member 400, that is, on the side facing the fixed end 402, and the light source unit 100 is disposed on the side facing one of the fixed end 402 and the free end 404 of the support member 400, that is, on the side facing the free end 404, as shown in FIG. 16. That is, in the atomic oscillator 13, the atom cell 310 is disposed on the side facing one of the fixed end 402 and the free end 404 of the support member 400, that is, on the side facing the fixed end 402, and the light source 120 is disposed on the side facing one of the fixed end 402 and the free end 404 of the support member 400, that is, on the side facing the free end 404. Further, the atom cell unit 300 is mounted to the first outer container surface 612 via the mount seat 611, and the light source unit 100 is mounted to the second outer container surface 622 directly or via a heat transfer member. At least one of a heat transfer member or a Peltier device may be disposed at the mount seat 611 or in the vicinity thereof.

In the atomic oscillator 13, the atom cell 310 is disposed on the side facing one of the fixed end 402 and the free end 404 of the support member 400, that is, on the side facing the fixed end 402, and the light source 120 is disposed on the side facing one of the fixed end 402 and the free end 404 of the support member 400, that is, on the side facing the free end 404, as described above. Therefore, in the atomic oscillator 13, the protrusion 440 can suppress shift of the light source 120 with respect to the atom cell 310.

Although not shown, the support member 400 only needs to have one portion fixed to the outer base 610, and the position of the fixed end 402 (fixed portion) may not be an end of the support member 400. For example, the fixed portion may be located in the vicinity of the center of the support member, and the opposite ends of the support member may each be a free end. In this case, the atom cell 310 may be disposed at one of the free ends with respect to the fixed portion, and the light source 120 may be disposed at the other free end with respect to the fixed portion. Further, the protrusion 440 may be disposed at each of the two free ends, or the protrusion 440 may be disposed at the free end the distance to which from the fixed end is longer.

2.4. Fourth Variation

Figure 17:
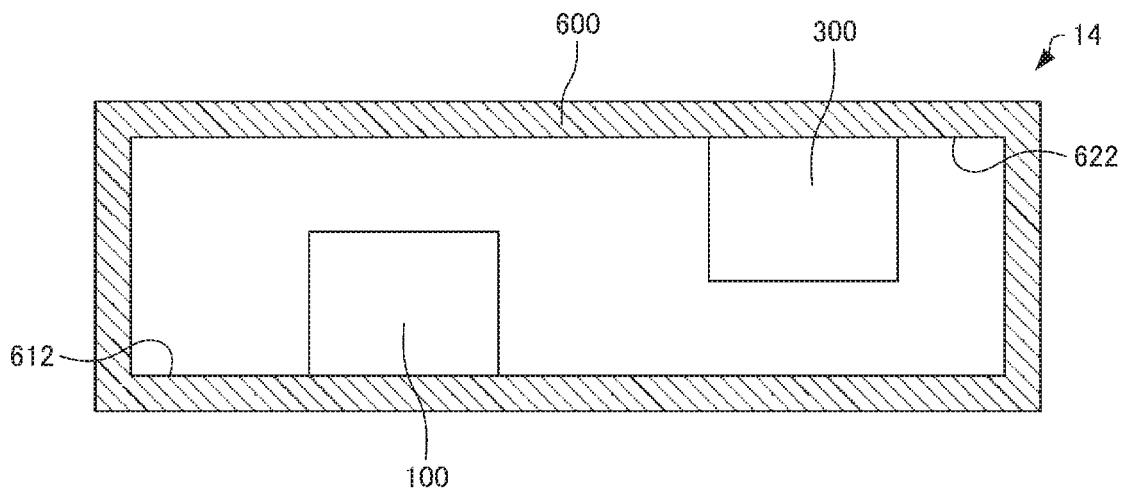
FIG. 17 is a cross-sectional view diagrammatically showing an atomic oscillator according to a fourth variation of the embodiment.

An atomic oscillator according to a fourth variation of the present embodiment will be described next with reference to the drawings. FIG. 17 is a cross-sectional view diagrammatically showing an atomic oscillator 14 according to the fourth variation of the present embodiment. In FIG. 17, members excluding the light source unit 100, the atom cell unit 300, and the outer container 600 are omitted and each of the members described above is drawn in a simplified form for convenience.

In the atomic oscillator 10 described above, the light source unit 100 and the atom cell unit 300 are disposed on the common support member 400, as shown in FIG. 2. Further, the light source unit 100 is mounted to the first outer container surface 612 via the support member 400, and the atom cell unit 300 is mounted to the second outer container surface 622 via the heat transfer member 392.

In contrast, the atomic oscillator 14 includes no support member 400, as shown in FIG. 17. For example, the light source unit 100 may be mounted directly to the first outer container surface 612, and the atom cell unit 300 may be mounted directly to the second outer container surface 622. Instead, although not shown, the light source unit 100 may be mounted to the first outer container surface 612 via a support member disposed on the first outer container surface 612, and the atom cell unit 300 may be mounted to the second outer container surface 622 via a support member disposed on the second outer container surface 622. In either case, the light source unit 100 and the atom cell 310 are disposed so that the light outputted from the light source unit 100 passes through the first space 312 in the atom cell 310. The configuration in the present variation can also suppress the heat transfer between the light source unit 100 and the atom cell unit 300.

2.5. Fifth Variation

Figure 18:
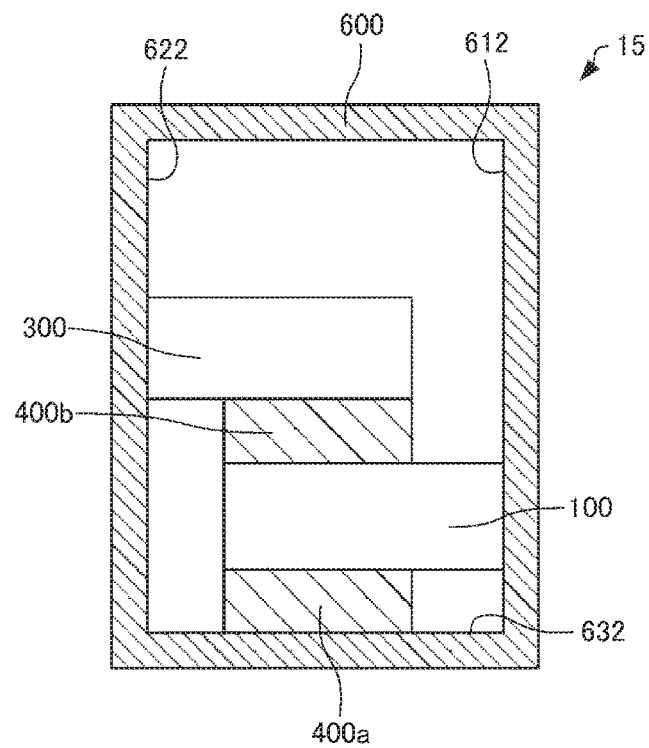
FIG. 18 is a cross-sectional view diagrammatically showing an atomic oscillator according to a fifth variation of the embodiment.

An atomic oscillator according to a fifth variation of the present embodiment will be described next with reference to the drawings. FIG. 18 is a cross-sectional view diagrammatically showing an atomic oscillator 15 according to the fifth variation of the present embodiment. In FIG. 18, members excluding the light source unit 100, the atom cell unit 300, support members 400a and 400b, and the outer container 600 are omitted and each of the members described above is drawn in a simplified form for convenience.

The atomic oscillator 15 differs from the atomic oscillator 10 described above in that the light source unit 100 and the atom cell unit 300 are layered on each other, as shown in FIG. 18. In the example shown in FIG. 18, the support member 400a, the light source unit 100, the support member 400b, and the atom cell unit 300 are layered on each other in the presented (sequential) order. The support member 400a is disposed on a third outer container surface 632, which connects the first outer container surface 612 and the second outer container surface 622 to each other. In the example shown in FIG. 18, the light source unit 100 is directly mounted to the first outer container surface 612, and the atom cell unit 300 is directly mounted to the second outer container surface 622. In the present variation, the support member 400b is made of a thermally insulating material. Specifically, the support member 400b is made of the same material of the positioning members 350 and 360 in the first embodiment. The light source unit 100 may instead be mounted to the first outer container surface 612 via another member, for example, a heat transfer member. The atom cell unit 300 may instead be mounted to the second outer container surface 622 via another member, for example, a heat transfer member. In either case, the light source unit 100 and the atom cell 310 are disposed so that the light outputted from the light source unit 100 passes through the first space 312 in the atom cell 310. The configuration in the present variation can also suppress the heat transfer between the light source unit 100 and the atom cell unit 300.

2.6. Sixth Variation

Figure 19:
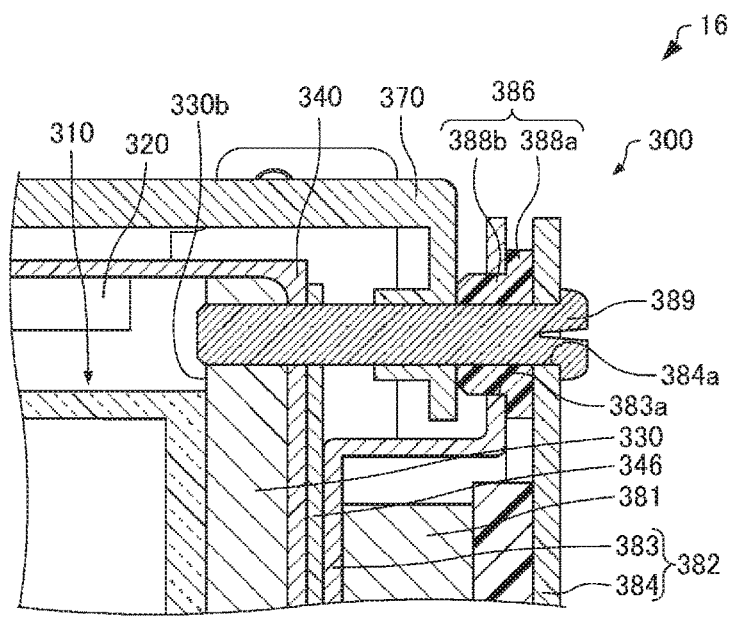
FIG. 19 is a cross-sectional view diagrammatically showing an atomic oscillator according to a sixth variation of the embodiment.

An atomic oscillator according to a sixth variation of the present embodiment will be described next with reference to the drawings. FIG. 19 is a cross-sectional view diagrammatically showing an atomic oscillator 16 according to the sixth variation of the present embodiment. In FIG. 19, part of the atom cell unit 300 is shown for convenience.

In the atomic oscillator 10 described above, the heater container 382 is fixed to the second atom cell container 370 with the screws 389, and the first holding member 330 is fixed to the first atom cell container 340 with the screw 331, as shown in FIG. 4.

In contrast, the atomic oscillator 16 includes screws 389 that fix the heater container 382 to the second atom cell container 370 and further fix the first holding member 330 to the first atom cell container 340, as shown in FIG. 19. That is, in the atomic oscillator 16, the first holding member 330, the first atom cell container 340, the heater container 382, and the second atom cell container 370 are all fastened with the screws 389.

Since the heater container 382 is fixed to the second atom cell container 370 with the screws 389, and the first holding member 330 is fixed to the first atom cell container 340 with the screws 389, the heating device 381 is pressed against the first atom cell container 340 toward the atom cell 310, and the atom cell 310 is pressed against the first atom cell container 340 toward the heating device 381. Therefore, the atom cell 310 can be efficiently heated, and the atom cell 310 can be disposed with high positional precision, as in the atomic oscillator 10 described above.

Since the atomic oscillator 16 includes the screws 389 that fix the heater container 382 to the second atom cell container 370 and further fix the first holding member 330 to the first atom cell container 340, the size of the atomic oscillator can be reduced as compared, for example, with the case where the atomic oscillator includes the screws 389 that fix the heater container 382 to the second atom cell container 370 and the screw 331, which fixes the first holding member 330 to the first atom cell container 340, as shown in FIG. 4.

2.7. Seventh Variation

Figure 20:
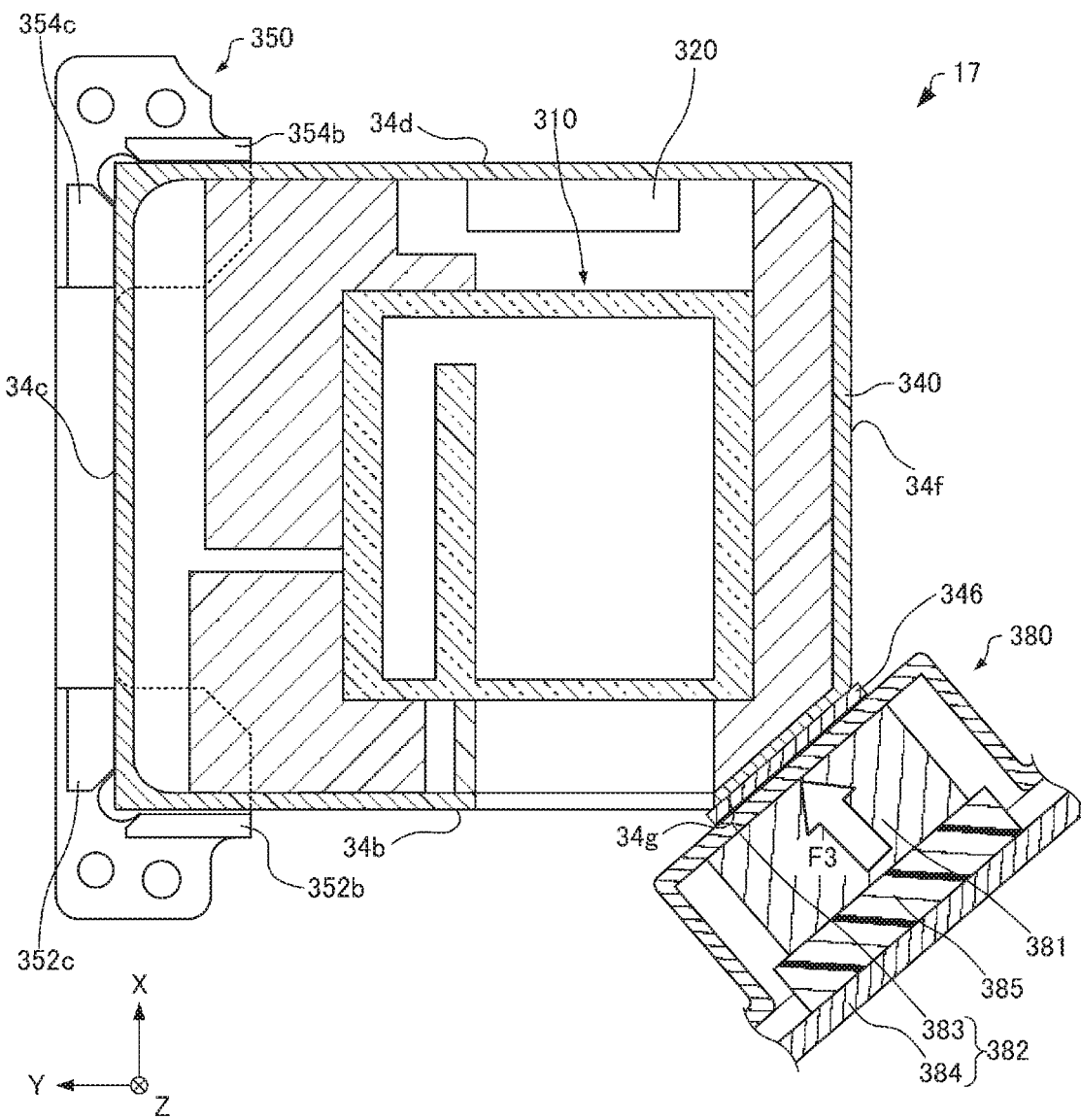
FIG. 20 is a cross-sectional view diagrammatically showing an atomic oscillator according to a seventh variation of the embodiment.

An atomic oscillator according to a seventh variation of the present embodiment will be described next with reference to the drawings. FIG. 20 is a cross-sectional view diagrammatically showing an atomic oscillator 17 according to the seventh variation of the present embodiment. In FIG. 20, members excluding the atom cell 310, the light receiving device 320, the heat transfer member 346, the first atom cell container 340, the first positioning member 350, and the heater unit 380 are omitted for convenience.

In the atomic oscillator 10 described above, the heating device 381 is pressed in the +Y-axis direction against the first atom cell container 340 (see arrow F2 in FIG. 13), whereby the first atom cell container 340 is pressed against the first positioning member 350, as shown in FIG. 13. The atom cell 310 is thus positioned in the Y-axis direction.

In contrast, in the atomic oscillator 17, the heating device 381 is pressed against the first atom cell container 340 in a direction that inclines with respect to the axis Y, that is, both in the +X-axis direction and the +Y-axis direction (see arrow F3 in FIG. 20), whereby the first atom cell container 340 is pressed against the first positioning member 350, as shown in FIG. 20. The atom cell 310 can therefore be positioned both in the X-axis and Y-axis directions.

In the example shown in FIG. 20, the first atom cell container 340 has an outer surface 34$g$. The outer surface 34$g$ is a surface which connects the outer surface 34$b$ and the outer surface 34$f$ to each other and where a perpendicular to the outer surface 34$g$ inclines with respect to the axes X and Y. The outer surface 34$g$ is a surface formed, for example, by truncating the corner formed by the outer surfaces 34$b$ and 34$f$. A perpendicular to the outer surface 34$g$ inclines with respect to the axis Y. In the example shown in FIG. 20, a perpendicular to the outer surface 34$g$ passes through the space between the axis X and the axis Y.

In the atomic oscillator 17, the heater container 382 is disposed on the outer surface 34$g$ of the first atom cell container 340. Therefore, when the heating device 381 (heater container 382) is pressed, the first atom cell container 340 is pressed so that the outer surface 34$c$, which is oriented in the +Y-axis direction, is pressed against the block walls 354$c$ and 352$c$ and the outer surface 34$d$, which is oriented in the +X-axis direction, is pressed against the block wall 354$b$. The atom cell 310 can therefore be positioned in the X-axis and Y-axis directions. Therefore, in the atomic oscillator 17, the atom cell 310 can be disposed with respect to the support member 400 with higher positional precision.

3. Frequency Signal Generation System

Figure 21:
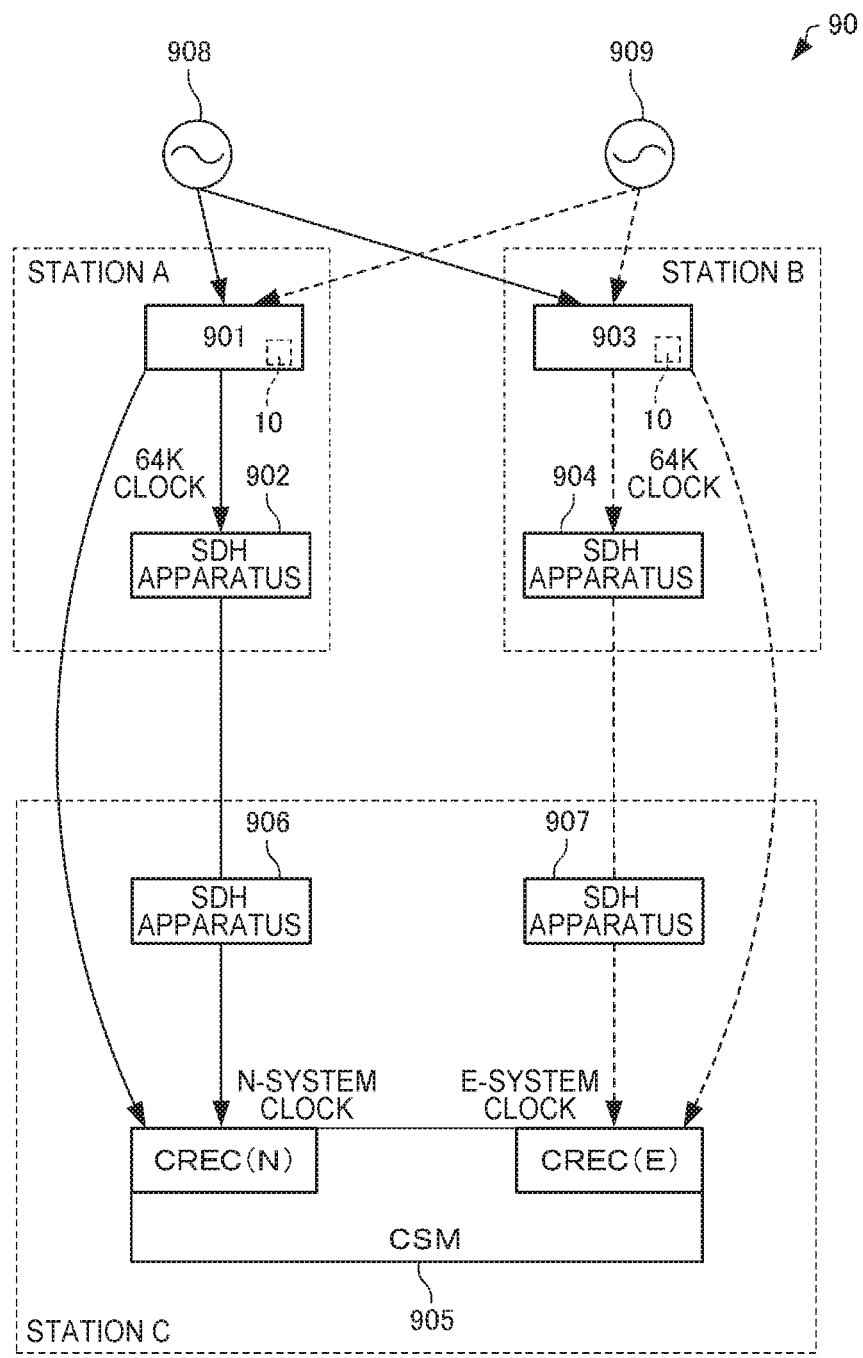
FIG. 21 is a schematic configuration diagram showing a frequency signal generation system according to an embodiment.

A frequency signal generation system according to an embodiment of the invention will be described next with reference to the drawings. The following clock transmission system (timing server) is an example of the frequency signal generation system. FIG. 21 is a schematic configuration diagram showing a clock transmission system 90.

The clock transmission system according to the embodiment of the invention includes the atomic oscillator according to the embodiment of the invention. In the following description, the clock transmission system 90 including the atomic oscillator 10 will be described by way of example.

The clock transmission system 90 is a system that causes clocks used in apparatus in a time division multiplex network to coincide with one another and has a normal-system (N-system) and emergency-system (E-system) redundant configuration.

The clock transmission system 90 includes a clock supply apparatus 901 and a synchronous digital hierarchy (SDH) apparatus 902 in a station A (upper-level station (N-system station)), a clock supply apparatus 903 and an SDH apparatus 904 in a station B (upper-level station (E-system station)), and a clock supply apparatus 905 and SDH apparatus 906, 907 in a station C (lower-level station), as shown in FIG. 21. The clock supply apparatus 901 includes the atomic oscillator 10 and generates an N-system clock signal. The atomic oscillator 10 in the clock supply apparatus 901 generates the clock signal in synchronization with more precise clock signals from master clocks 908 and 909 each including a cesium-based atomic oscillator.

The SDH apparatus 902 transmits and receives a primary signal, superimposes the N-system clock signal on the primary signal, and transmits the resultant signal to the lower-level clock supply apparatus 905 based on the clock signal from the clock supply apparatus 901. The clock supply apparatus 903 includes the atomic oscillator 10 and generates an E-system clock signal. The atomic oscillator 10 in the clock supply apparatus 903 generates the clock signal in synchronization with the more precise clock signals from the master clocks 908 and 909 each including a cesium-based atomic oscillator.

The SDH apparatus 904 transmits and receives a primary signal, superimposes the E-system clock signal on the primary signal, and transmits the resultant signal to the lower-level clock supply apparatus 905 based on the clock signal from the clock supply apparatus 903. The clock supply apparatus 905 receives the clock signals from the clock supply apparatus 901 and 903 and generates a clock signal in synchronization with the received clock signals.

The clock supply apparatus 905 usually generates the clock signal in synchronization with the N-system clock signal from the clock supply apparatus 901. In a case where abnormality occurs in the N system, the clock supply apparatus 905 generates the clock signal in synchronization with the E-system clock signal from the clock supply apparatus 903. Switching the N system to the E system as described above allows stable clock supply to be ensured and the reliability of the clock path network to be increased. The SDH apparatus 906 transmits and receives the primary signal based on the clock signal from the clock supply apparatus 905. Similarly, the SDH apparatus 907 transmits and receives the primary signal based on the clock signal from the clock supply apparatus 905. The apparatus in the station C can thus be synchronized with the apparatus in the station A or B.

The frequency signal generation system according to the present embodiment is not limited to the clock transmission system. The frequency signal generation system includes any system that incorporates an atomic oscillator and is formed of a variety of apparatus and a plurality of apparatus using the frequency signal from the atomic oscillator.

The frequency signal generation system according to the present embodiment may, for example be a smartphone, a tablet terminal, a timepiece, a mobile phone, a digital still camera, a liquid ejection apparatus (inkjet printer, for example), a personal computer, a television receiver, a video camcorder, a video tape recorder, a car navigator, a pager, an electronic notepad, an electronic dictionary, a desktop calculator, an electronic game console, a word processor, a workstation, a TV phone, a security television monitor, electronic binoculars, a point-of-sales (POS) terminal, a medical apparatus (such as electronic thermometer, blood pressure gauge, blood sugar meter, electrocardiograph, ultrasonic diagnostic apparatus, electronic endoscope, and magnetocardiograph), a fish finder, a global navigation satellite system (GNSS) frequency standard, a variety of measuring apparatus, a variety of instruments (such as instruments in automobile, airplane, and ship), a flight simulator, a ground digital broadcast system, a mobile phone station, and a vehicle (such as automobile, airplane, and ship).

In the invention, part of the configuration thereof may be omitted and the embodiments and variations may be combined with each other to the extent that the features and effects described in the present application are provided.

The invention encompasses substantially the same configuration as the configuration described in the embodiment (for example, a configuration having the same function, using the same method, and providing the same result or a configuration having the same purpose and providing the same effect). Further, the invention encompasses a configuration in which an inessential portion of the configuration described in the embodiment is replaced. Moreover, the invention encompasses a configuration that provides the same advantageous effect as that provided by the configuration described in the embodiment or a configuration that can achieve the same purpose as that achieved by the configuration described in the embodiment. Further, the invention encompasses a configuration in which a known technology is added to the configuration described in the embodiment.

What is claimed is:

1. An atomic oscillator comprising:
    a light source assembly including:
       a light source; and
       a first temperature control device configured to control a first temperature of the light source;
    an atom cell assembly including:
       an atom cell accommodating an alkali metal atom therein and receiving light emitted from the light source; and
       a second temperature control device configured to control a second temperature of the atom cell, the second temperature being different from the first temperature;
    a container housing the light source assembly and the atom cell assembly therein, the container having a first surface and a second surface, the second surface being different from the first surface; and
    a substrate on which the light source assembly and the atom cell assembly are disposed,
    wherein the light source assembly is mounted to the first surface,
    a first air gap is present between the light source assembly and the second surface,
    the atom cell assembly is mounted to the second surface, and
    a second air gap is present between the atom cell assembly and the first surface, and
    wherein a thermal resistance along a path between the light source assembly and the atom cell assembly via the substrate is higher than a thermal resistance between the light source assembly and the first surface and a thermal resistance between the atom cell assembly and the second surface.

2. The atomic oscillator according to claim 1, wherein the first surface and the second surface face each other.

3. The atomic oscillator according to claim 1, wherein the container includes:
    a base that has the first surface, and
    a lid that has the second surface and is discrete from the base.

4. The atomic oscillator according to claim 3, wherein the container includes an insert located between the base and the lid and having a thermal conductivity that is lower than a thermal conductivity of the base and a thermal conductivity of the lid.

5. The atomic oscillator according to claim 1, wherein the substrate is disposed on the first surface, and a heat transfer plate is disposed between the substrate and the first surface of the container, and a thermal conductivity of the heat transfer plate is higher than a thermal conductivity of the container.

6. The atomic oscillator according to claim 1, wherein the atom cell assembly includes an atom cell container housing the atom cell therein, and a thermally insulating plate is disposed between the atom cell container and the substrate.

7. The atomic oscillator according to claim 1, wherein the light source assembly is spaced apart from the container except at the first surface, and the atom cell assembly is spaced apart from the container except at the second surface.

8. An atomic oscillator comprising:
    a substrate;
    a light source;
    an atom cell accommodating an alkali metal atom therein and receiving light emitted from the light source;
    a support on which the light source and the atom cell are disposed, the support including:
       a fixed end fixed to the substrate; and
       a free end separated from the substrate via a first air gap; and
    a protrusion projecting from the support toward the substrate, the protrusion being located proximate the free end and relatively distant from the fixed end,
    wherein, when an external force is applied to the atomic oscillator, the support is moves between a bent state and a non-bent state,
    when the support is in the bent state, the protrusion comes into contact with the substrate before the support, and
    when the support is in the non-bent state, the support maintains the first air gap between the free end and the substrate and the protrusion maintains a second air gap between the protrusion and the substrate.

9. The atomic oscillator according to claim 8, wherein at least part of the protrusion facing the substrate is made of a thermally insulating material.

10. The atomic oscillator according to claim 8, wherein at least part of the substrate facing the protrusion is made of a thermally insulating material.

11. The atomic oscillator according to claim 8, wherein the light source is disposed at the fixed end of the support, and the atom cell is disposed at the free end of the support.

12. The atomic oscillator according to claim 11, further comprising a container housing the light source, the atom cell, and the support, the container including a lid and the substrate,
wherein the atom cell is mounted to the lid.

13. The atomic oscillator according to claim 8, wherein the atom cell is disposed at the fixed end of the support, and the light source is disposed at the free end of the support.

14. An atomic oscillator comprising:
a container including:
- a base that has a first interior surface; and
- a discrete lid that has a second interior surface facing the first interior surface;

a light source assembly mounted to the first interior surface and spaced apart from the second interior surface by a first air gap, the light source assembly including:
- a light source; and
- a first temperature control device configured to control a first temperature of the light source; and an atom cell assembly mounted to the second interior surface and spaced apart from the first interior surface by a second air gap, the atom cell assembly including:
- an atom cell accommodating an alkali metal atom therein and receiving light emitted from the light source; and
- a second temperature control device configured to control a second temperature of the atom cell, the second temperature being different from the first temperature.

15. The atomic oscillator according to claim 14,
further comprising a substrate on which the light source assembly and the atom cell assembly are disposed,
wherein a thermal resistance along a path between the light source assembly and the atom cell assembly via the substrate is higher than a thermal resistance between the light source assembly and the first interior surface and a thermal resistance between the atom cell assembly and the second interior surface.

16. The atomic oscillator according to claim 15,
wherein a heat transfer plate is disposed between the substrate and the container, and a thermal conductivity of the heat transfer plate is higher than a thermal conductivity of the container.

17. The atomic oscillator according to claim 15,
wherein the atom cell assembly includes an atom cell container housing the atom cell therein, and
a thermally insulating plate is disposed between the atom cell container and the substrate.

* * * * *